United States Patent [19]

Johnson et al.

[11] Patent Number: 5,838,274
[45] Date of Patent: *Nov. 17, 1998

[54] SYSTEMS FOR ACHIEVING ENHANCED AMPLITUDE RESOLUTION

[75] Inventors: Keith O. Johnson, Pacifica; Michael W. Pflaumer, Berkeley, both of Calif.

[73] Assignee: Pacific Microsonics, Inc., Berkeley, Calif.

[ * ] Notice: The term of this patent shall not extend beyond the expiration date of Pat. No. 5,479,168.

[21] Appl. No.: 782,834

[22] Filed: Jan. 13, 1997

Related U.S. Application Data

[60] Continuation of Ser. No. 456,236, May 31, 1995, abandoned, which is a division of Ser. No. 110,335, Aug. 20, 1993, Pat. No. 5,479,168, which is a continuation of Ser. No. 957,631, Oct. 6, 1992, abandoned, which is a continuation of Ser. No. 707,073, May 29, 1991, abandoned.

[51] Int. Cl.$^6$ ..................................................... H03M 1/00
[52] U.S. Cl. ............................ 341/155; 341/110; 341/139
[58] Field of Search ................................. 395/2, 2.1, 2.14, 395/2.15, 2.2, 2.21, 2.28, 2.33, 2.34, 2.35, 2.36, 2.37; 341/110, 122, 138, 139, 144, 155

[56] References Cited

U.S. PATENT DOCUMENTS

| | | | |
|---|---|---|---|
| 3,919,657 | 11/1975 | Howlett et al. | 330/51 |
| 3,999,129 | 12/1976 | Kasson | 325/42 |
| 4,187,466 | 2/1980 | Kasson et al. | 325/42 |
| 4,219,880 | 8/1980 | Nichols | 364/718 |
| 4,472,747 | 9/1984 | Schwartz | 360/32 |
| 4,546,342 | 10/1985 | Weaver et al. | 340/347 |
| 4,618,851 | 10/1986 | Watanabe | 341/144 |
| 4,700,362 | 10/1987 | Todd et al. | 375/30 |
| 4,710,747 | 12/1987 | Holland | 340/347 |
| 4,788,685 | 11/1988 | Sako et al. | 371/38 |
| 4,831,464 | 5/1989 | Chijiiwa | 360/32 |
| 4,849,957 | 7/1989 | Suzuki | 369/59 |
| 4,903,020 | 2/1990 | Wermuth et al. | 341/106 |
| 4,908,722 | 3/1990 | Sonobe | 360/46 |
| 4,914,438 | 4/1990 | Nakahashi et al. | 341/131 |
| 4,933,675 | 6/1990 | Beard | 341/110 |
| 4,940,977 | 7/1990 | Mandell | 341/143 |
| 5,055,845 | 10/1991 | Ridkosil | 341/155 |
| 5,089,820 | 2/1992 | Gorai et al. | 341/139 |
| 5,146,457 | 9/1992 | Veldhuis et al. | 370/111 |

FOREIGN PATENT DOCUMENTS

| | | |
|---|---|---|
| 0 255 111 A3 | 7/1987 | European Pat. Off. . |
| 0 349 664 A1 | 7/1988 | European Pat. Off. . |
| 0 379 613 A1 | 1/1989 | European Pat. Off. . |

OTHER PUBLICATIONS

John Vanderkooy & Stanley P. Lipshitz, Dither in Digital Audio, 8013 Journal of the Audio Engineering Society 35 (1987) Dec., No. 12, New York, New York.

*Primary Examiner*—Howard L. Williams
*Attorney, Agent, or Firm*—Fulwider Patton Lee & Utecht, LLP

[57] ABSTRACT

An electronic method and apparatus for signal encoding and decoding to provide ultra low distortion reproduction of analog signals, while remaining compatible with industry standardized signal playback apparatus not incorporating the decoding features of the invention, and wherein the improved system provides an interplay of gain, slew rate and wave synthesis operations to reduce signal distortions and improve apparent resolution, all under the control of concealed control codes for triggering appropriate decoding signal reconstruction compensation complementing the signal analysis made during encoding. In addition, signals lacking the encoding process features of the invention are likewise compatible with playback decoders which do embody the invention, to provide some overall restoration enhancement.

9 Claims, 20 Drawing Sheets

INPUT SIGNAL
( -60dB
400 Hz TRIANGLE )

DECODED SIGNAL
FROM 16 BIT SYSTEM
WITH 14 BIT MONOTONICITY

HIGH FREQUENCY
WEIGHTED RANDOM
NOISE 2 LSB
AVERAGE AMPLITUDE

NOISE AND
SIGNAL ADDED

REPRODUCED
WAVEFORM WITH
HIGH FREQUENCIES
REMOVED

SIGNAL FROM
LOW PASS FILTER
( SONY IC 103 )
( APPROX 2 kHz )

OUTPUT FROM
LIMITER TO
SONY IC 102
( SAMPLE AND HOLD AMP )

LIMITED
PORTION OF SIGNAL
( "TEST" )

SAMPLED AND
REPRODUCED SIGNAL
IC 106

EXPANDED
PORTION OF SIGNAL

FILTERED
REPRODUCE
OUTPUT

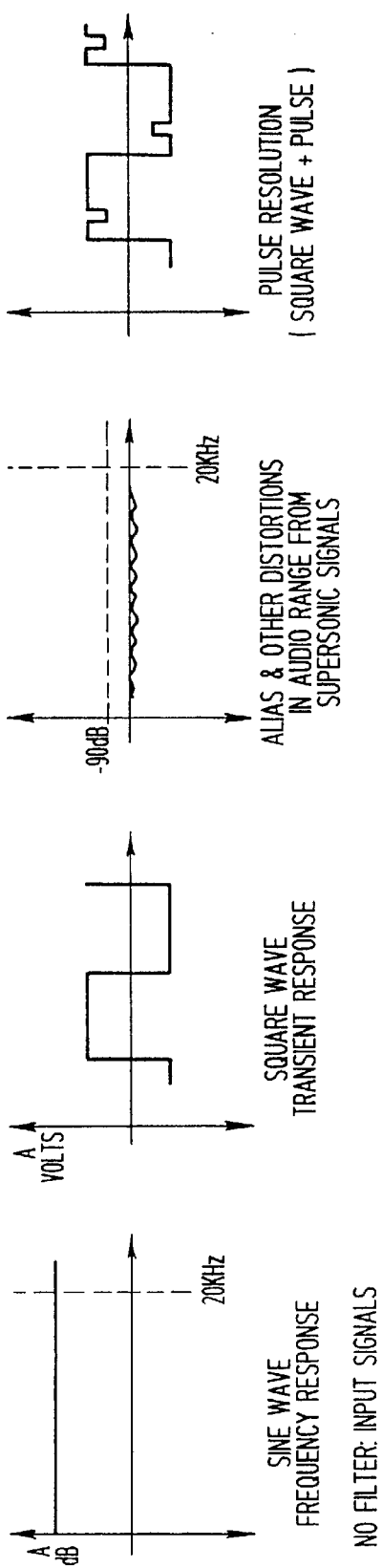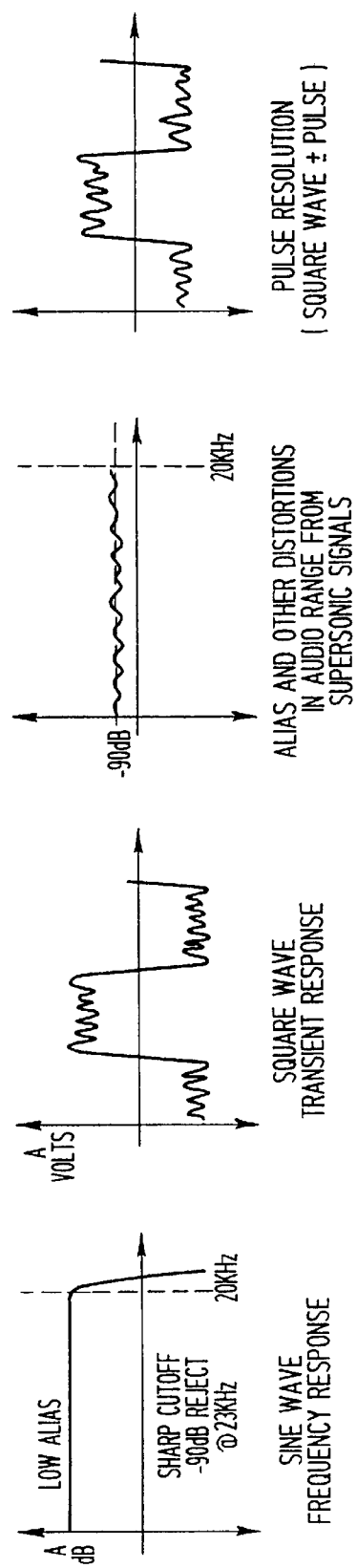

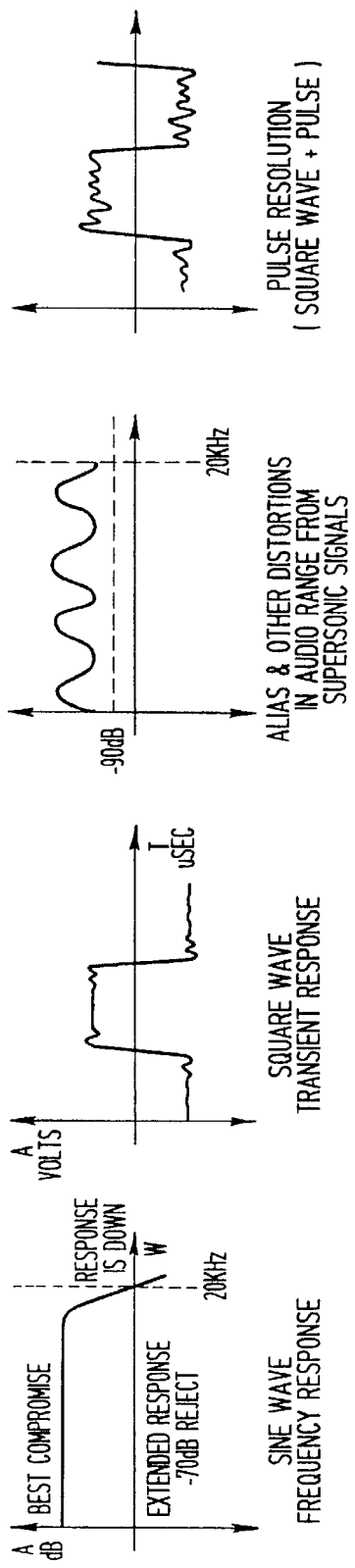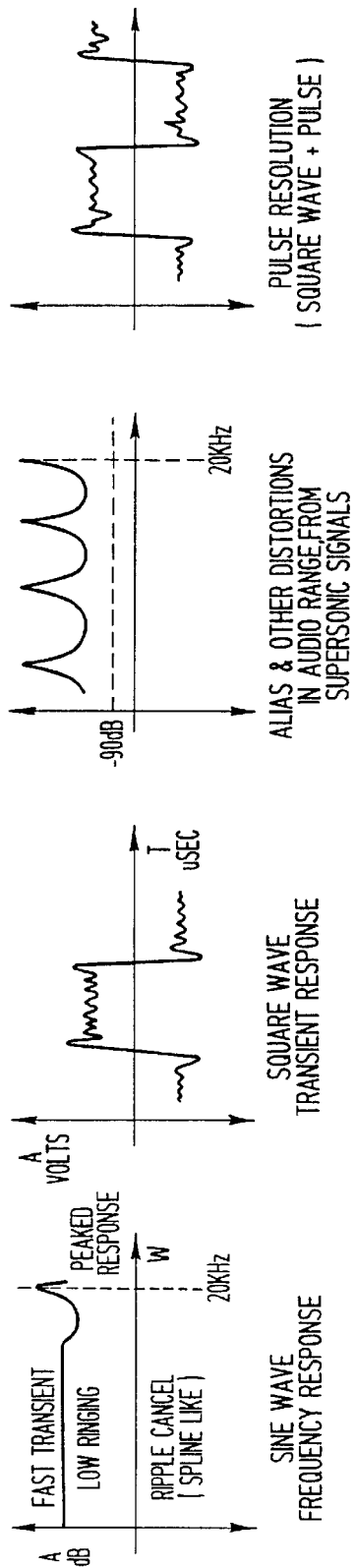

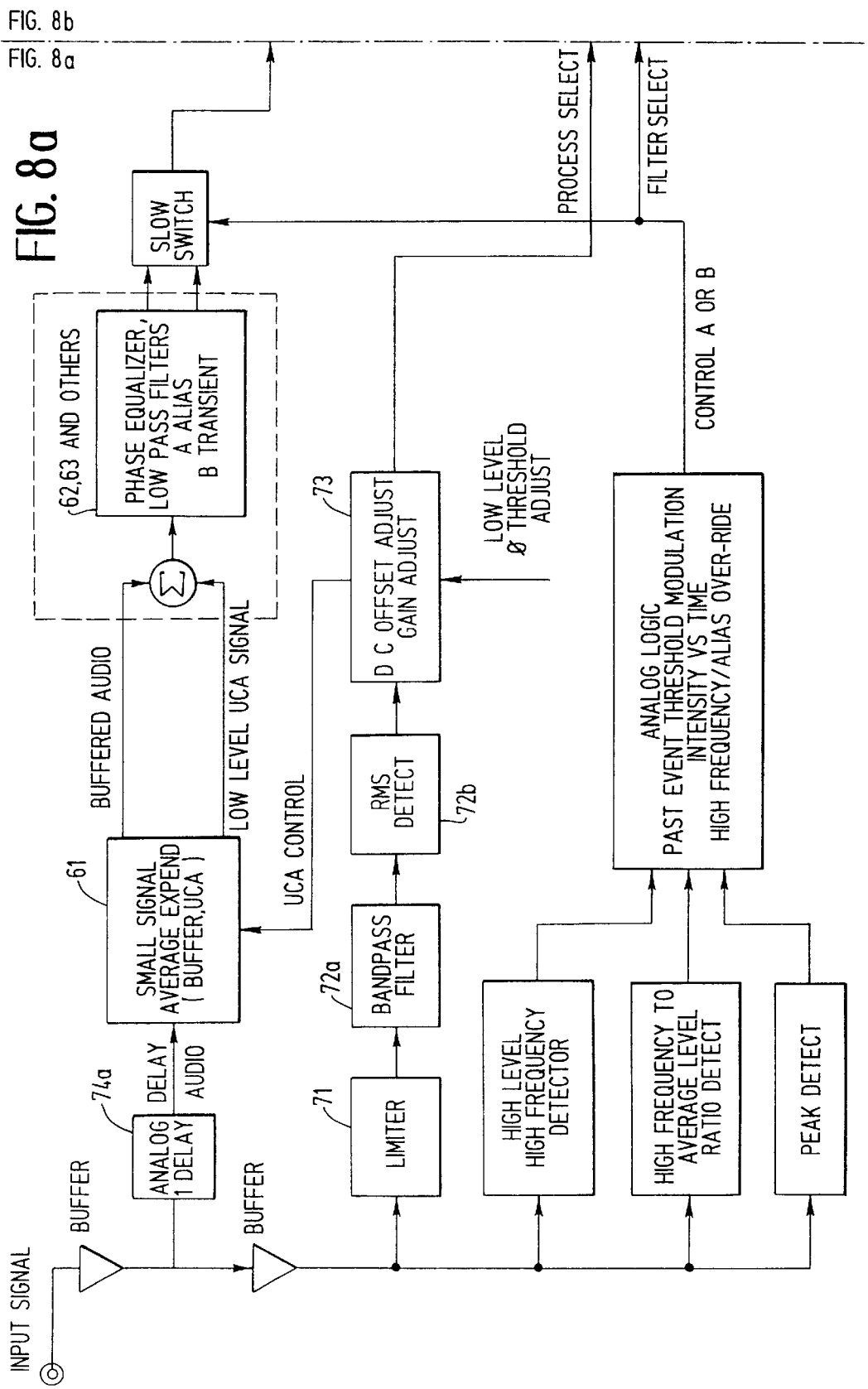

INPUT SIGNAL

FILTERED SIGNAL

SLEW RATE LIMITED

CORRECTION SIGNAL

RECONSTRUCTED SIGNAL ns, operation, and difficulties. In its simplest form, the recorder includes a sampling switch and an analog to digital converter. The switch breaks the continuous analog signal into a series of voltage steps, each of which is converted to number groups or digital words. Digital level meters and simple communication systems often operate with just these functions in a single IC chip. Practical high performance record and playback systems require many added operations to prevent undesired internal and external analog-digital signal interactions, as well as beats and non-linear feed-through between digital and analog frequencies. Well-known technologies to deal with these problems include sharp cut-off or "brick wall" low-pass filters, fast sample and hold circuits, and high common mode rejection amplifiers. Unfortunately, although these components and subsystems solve many problems, they also create others.

SYSTEMS FOR ACHIEVING ENHANCED AMPLITUDE RESOLUTION

BACKGROUND OF THE INVENTION

This application is a continuation of application Ser. No. 08/456,236, filed May 31, 1995, now abandoned, which is a divisional of Ser. No. 08/110,335 filed Aug. 20, 1993, now U.S. Pat No. 5,479,168 issued Dec. 26, 1995, which is a continuation of Ser. No. 07/957,631 filed Oct. 6, 1992, now abandoned which is a continuation of Ser. No. 07/707,073 filed May 29, 1991, now abandoned.

This invention relates generally to improvements in signal encoding/decoding methods and apparatus and, more particularly, to a new and improved digital encoding and decoding system for lower distortion, higher resolution, and increased dynamic range reproduction of analog signals while remaining compatible with industry standardized signal playback apparatus and standards not incorporating the decoding features of the present invention. In addition, recordings lacking the encoding process features of the invention are likewise compatible with playback decoders which do embody the invention, and are provided some enhancement.

Quite often a recording or communications system is standardized and its format cannot be readily altered without affecting a substantial quantity of equipment already in existence. Hence, adding information with supplemental codes may not always be practical unless provisions have been standardized for such insertions. Unfortunately, modern digital systems are not very expandable since data bandwidth, resolution, error correction, synchronization, ancillary data and other "housekeeping" information essentially occupy the entire digital capacity of the storage or transmission medium.

However, electronic equipment manufacturers and users of such devices continue to seek enhanced performance and more features from such standardized systems. An important example is the need to make a compatible recording well suited simultaneously for portable, automotive, television and audiophile markets. Today, many recordings are made for the most profitable market while other users suffer compromised sonics. The obvious conflicting performance requirements of different listening environments and the need for sonic improvement should desirably be implemented by a new system which is compatible with older systems and recordings.

Automobile and portable equipment are usually low cost and must operate in noisy environments. Hence, in such situations, a slightly restricted dynamic range playback is beneficial. Audiophile systems require utmost accuracy, dynamic range, and resolution beyond that which is available in the current standards. Thus, in any new compatible system, as provided by the present invention, encoded dynamics and slew rate modifications which achieve lowest distortion and best resolution for the audiophile when decoded, should also provide improved sonics for portable and automotive playback when not decoded.

Compact Disc pulse code modulation and other digital audio encoding schemes are good examples of highly developed and standardized systems which push signal conditioning and digital information limits. Most such digital systems originally evolved around then practical 2.5 to 3.5 mHz rotary head video recorder bandwidths. In such standards, the data bits with error correction and housekeeping entirely fill the available bandwidth. Accordingly, the need for a "smart" optimization technique, which does not rely upon increased bandwidth for its implementation, becomes apparent.

By way of background, let us consider a typical digital audio record-play system, its most frequently encountered components, operation, and difficulties. In its simplest form, the recorder includes a sampling switch and an analog to digital converter. The switch breaks the continuous analog signal into a series of voltage steps, each of which is converted to number groups or digital words. Digital level meters and simple communication systems often operate with just these functions in a single IC chip. Practical high performance record and playback systems require many added operations to prevent undesired internal and external analog-digital signal interactions, as well as beats and non-linear feed-through between digital and analog frequencies. Well-known technologies to deal with these problems include sharp cut-off or "brick wall" low-pass filters, fast sample and hold circuits, and high common mode rejection amplifiers. Unfortunately, although these components and subsystems solve many problems, they also create others.

Briefly, in typical digital recording systems, low-pass filters ring, and if of analog construction, have pre-echo, are subject to sudden phase shifts near band edge, and have capacitors which often cause troublesome dielectric hysteresis effects. Sample and hold circuits have unpredictable timing and capture errors for different signal slew rates and also suffer from capacitor problems. Fast digital signals and the high speed amplifiers needed to handle them often create and are sensitive to ground currents which can cause audible strobe-beat effects. Digital reproducing systems have similar problems, along with spike or glitch generation caused by digital to analog conversion, and digital filter word length round off problems. Usually the recorder is designed to have state of the art performance while that of the reproducer degrades depending on the economies of "consumer" construction. These and other problems continue to plague modern high performance digital audio systems.

Unfortunately, such technical difficulties usually create jarring non-harmonic distortions, typically centered in the most sensitive and perceptive human hearing range. Often these distortions are caused by the highest, almost inaudible frequencies contained within the program material. Taking the ratio of high and low frequency hearing acuity into account, and the fact that sounds unrelated to the program material stand out, the presence of even an extraordinarily small amount of these distortions can be quite objectionable to the listener. Fortunately, often only very small corrections are needed to minimize some of these distortions. However, left as is, these distortion errors can combine to yield the equivalent of 13 to 14 bit performance accuracy from systems originally designed for 16 bit resolution. In practice, while some feel the advantages of current digital recordings outweigh the disadvantages of their distortion errors, many sophisticated listeners and audiophiles are not so tolerant.

Accordingly, those concerned with the development and use of digital signal encoding and decoding systems for analog signals have long recognized the need for a higher quality, lower distortion digital system for reproduction of such analog signals, which for all practical purposes is also compatible with existing equipment standards. The present invention fulfills all of these needs.

SUMMARY OF THE INVENTION

Briefly, and in general terms, the present invention provides new and improved digital encoding/decoding methods and apparatus for ultra low distortion reproduction of analog signals which are also compatible with industry standardized signal playback apparatus not incorporating the decoding features of the present invention. In addition, signals lacking the encoding process features of the invention are likewise compatible with playback decoders which do embody the invention, and are provided some overall enhancement.

Basically, the present invention is directed to various aspects of an improved encode/decode system for providing a predetermined balance or interplay of gain structures, filter characteristics, various slew rate modifications, and wave synthesis operations to reduce signal distortions and improve apparent resolution. During the encoding process, an analysis of the signal to be encoded is made over time and the results of this analysis are subsequently utilized in the encoding and decoding process to more accurately reconstruct the original waveform upon playback. This is accomplished while minimizing the deleterious effects normally encountered in sampling and converting analog signals to digital signals and subsequently reconverting the digital signals back to an accurate simulation of the original analog waveform.

In accordance with the invention, control information developed during the aforedescribed waveform analysis is concealed within a standard digital code and this information is subsequently used to dynamically change and control the reproduction process for best performance. These concealed control codes trigger appropriate decoding signal reconstruction compensation complementing the encoding process selected as a result of the aforementioned signal analysis. Since the control code is silent and the overall digital information rate is normally fixed, the process can operate compatibly with existing equipment and industry standards. In addition, and as previously indicated, signals lacking the encoding process features of the invention are likewise compatible with playback decoders which do embody the invention, to provide some beneficial enhancement.

To achieve higher performance with a fixed information rate, an on-going trade-off is made between dynamic range, to achieve improved small signal resolution, and peak level and/or slew rate, to achieve fast signal response accuracy. These small change and fast change aspects of a signal, as well as large and small amplitude aspects, each have their own digital distortion or system compromise mechanisms. Since both large and small aspects will not occur at the same time, an optimum encoding process or mix of processes favoring each signal condition can be chosen dynamically, in accordance with the invention, to achieve an improved signal reproduction within a fixed digital information rate. A silent or hidden control code documents these changes from time to time in the signal encoding process and is used to create the complementary level, slew rate, filter character, and waveform synthesis necessary to restore the original signal during the decoding process.

In a presently preferred embodiment of the invention, the encoder system has much higher resolution and speed than the industry standard or encoded product, and is set up as an acquisition system with sufficient look forward and look behind memory to compute the optimum processing of the signal and its corresponding reconstruction control code. As previously noted, the processing of the signal is determined based on a consideration of which trade-offs of resolution, speed, and level are most appropriate for the signal conditions over time and how the reproducer can best be programmed to allow the most accurate reproduction of the original analog signal.

To be inaudible, the computed reconstruction control signal is encoded or encrypted to a random number sequence which may be inserted continuously or dynamically when needed into the least significant digital bit or bits. The processed audio or signal becomes encoded to the remaining bits.

Conventional decoding by a simple digital to analog converter of all bits of a recording encoded in accordance with the invention, yields a signal with slightly less dynamic range and only slightly higher background noise. However, the signal will have lower quantization and slew induced distortions and, hence, the processed encoded product, when reproduced on non-decoding standard equipment, will sound equal to or better than an unencoded product.

A fully decoding player, in accordance with the invention, retrieves the control signal and uses it to set up, operate and dynamically change a complementary process to recover the pre-computed high accuracy information and provide low distortion reproduction of the original analog signal. Operations to do this include fast peak expansion, averaged low level gain reductions, selecting complementary interpolation filters, waveform synthesis, and others. When these are selected according to ongoing trade-offs, optimum for a particular set of signal conditions, an apparent increase of bandwidth and resolution occurs.

An improved digital system, in accordance with the invention, uses groups of dynamically changing predetermined performance trade-offs made when signal conditions of the recorded program would create distortion. Since digital distortions occur at extremes of high level, slew rate, and high frequencies, on one hand, and with quiet signals and short small transients on the other hand, a best encode/decode strategy is chosen for that extreme without the process compromise hurting the opposite aspects of the program. To achieve this, the program is delayed long enough so that a most likely distortion mechanism is identified prior to its emergence from the time delay, thereby allowing a best encoding strategy and complementary decoding method to be determined and encoded. Performance is improved because any distortion compromise made occurs for opposite signal conditions, which are essentially nonexistent at that time.

In the simplest form of the system, an encoded dynamic range compression and complementary reproduce expansion will improve performance. Furthermore, improvements are had by using averaged levels of small signals independent of their lower frequency and near supersonic frequency spectral components to control processing providing improved complementary restored resolution. In a similar manner, the strongest signals receive processing having DC to maximum bandwidth for instantaneous peak conditions, which also yields best complementary restoration. Only one correction need operate at a time and, hence, digital information is saved, or conversely, more apparent performance is obtained from an unchanged digital information rate.

In addition, a further reduction of known and predictable digital distortions occurs by selecting a best low pass filter with the least compromise for program conditions during encoding and using a complementary interpolation or low pass filter during reproduction. Also, other improvements are had from the reduction of known recurrent distortions, such as transient errors, by synthesizing these components from lookup table curves of these distortions or missing information, and then scaling these to the signal at hand.

All of the aforedescribed improvements can also operate with varying degrees of success in a default or "open loop" mode at the reproducer by detecting information about the encoded signal and then varying these processes from the detected signal.

Digital systems typically have a very high signal to noise ratio, but have a restricted working dynamic range of levels and restricted frequency response. The improved system of the present invention reduces distortions and, as such, uses signal character dependent gain changes, filter optimization, slew rate processing, and waveform reconstruction or synthesis to do this. The improved system computes, within memory and process time limits, a continuously changing best compromise strategy of available processes to give the best signal reconstruction. This obviously complex task yields a restoration control signal silently encrypted or noise disguised in a least significant bit code. By comparison, the reproducer system is simple, since its decoding and complementary signal restoration can occur with conventional multiplying converters, digital signal processors and other analog and digital devices similar to or already used in consumer electronics.

A conventional recording and reproducing digital system appears relatively simple and potentially accurate for all the data bits encoded. In practice, however, using a very near to theoretical minimum sampling rate and the least acceptable number of data bits substantially aggravates speed and accuracy limitations from even the best state-of-the-art circuits and components. In this regard, the worst offenders are items such as filters, sample and hold circuits, analog-to-digital converters, digital-to-analog converters, and system grounding, timing and various process interactions and crosstalk.

The aforedescribed practical technological difficulties and their potential distortions can be greatly minimized by using higher sampling rates and more data bits than current standards allow. In fact, current technological capability permits the reduction of cross-talk, time jitter and other noise interaction problems which, along with digital bandwidth limitations, prevented the practical implementation of higher data rates when current digital standards were first envisioned and established. With today's high speed converters operating much faster with more data bits, filters can become less severe and the greater difference between highest audio frequencies and the digital sampling rate then reduces beats, sideband foldovers, aliasing, as well as loss of small signal information. The present invention uses these capabilities by employing a high speed conversion process. The digital information rate, though now much higher, can be computed, as an ongoing acquisition process, to an "error free" mathematically filtered lower sampling rate 16 bit code compatible with current standards. Most decimation oversampling encoders work like this. However, in addition, the invention anticipates alias, aperture, interpolation and amplitude resolution distortions from an "ideal" standard reproducer and computes them during the encoding process for correction during reproduction. When the full process of the invention is used, even certain frequencies above the audio range or Nyquist limit of industry standard equipment can be sent through the system without creating subharmonic or foldover distortions. Hence, a closer to perfect record/playback system is provided with minimal problems from filters, converters, and other components or subsystems while remaining compatible with industry standards.

For a Compact Disc system, "perfect" reproduction to 16 bit industry standards will have a maximum of 65,536 well defined equally spaced resolution steps, each about 150 microvolts in amplitude when scaled to normal professional audio levels (10 volts peak-to-peak maximum). This number, when stepped consecutively at the industry standard 44.1 kHz sampling rate, provides a slew of less than 7 volts per second. Faster rates will skip numbers until, for a 10 kHz triangle segment, only 2.2 sample points remain to define that waveshape as it would be filtered to its 20 kHz bandwidth. In this regard, more than a 1 giga Hertz sample rate would be required to include all 65,536 resolution points to create that wave segment. Fortunately, an ideal interpolation filter will fill in all of these points provided the 2.2 samples have been timed accurately enough. To do this to achieve a one half bit RMS averaged accurate sample of a fast changing signal the sample timing must occur within:

$$\frac{50 \text{ uSec}}{10 \text{ Volt}} = \frac{X \text{ pico second } (RMS)}{pp150 \text{ u Volt}/4 \text{ sqrt}(2)}$$

$$X = 375 \times 10^{-12}/2 \text{ sqrt}(2) = 133 \text{ pico sec.}$$

This sample, accurate in time and amplitude, must be held long enough for conversion to digital code. Usually, a charge on a capacitor represents this information. However, most dielectrics and insulators used to fabricate capacitors have complex losses as well as past history memory which create a complex delayed voltage change, field re-distribution errors and leakage. When abrupt changes in level from sample to sample occur, as they do with sampled high frequency audio signals, these errors often become much greater than when signal levels don't change. To have less than a half LSB of RMS averaged error the hold accuracy becomes:

$$\frac{150 \text{ u Volt}/LSB \times 44.1 \text{ kHz}}{2 \times \text{sqrt}(2)} = 2.3 \text{ volt/sec}$$

or about 2.3 u Volt per u sec.

Such performance is well beyond simple applications of most modern electrical passive components, much less integrated circuits. Obviously, practical consumer playback equipment will not do better, and the resulting errors can produce slew rate related transient intermodulation distortion components, which are among the most audibly objectionable. Specifically, these result from acquisition time uncertainty or jitter, slew rate related non-linear switching offsets, various types of dielectric hysteresis causing previous event related errors, polarity dependent sample discrepancies, and unpredictable hysteresis within converters as well as other factors. Thus, practical systems often have complex signal related errors as high as twenty times more than theoretical resolution limits of the current 16 bit standard. Hence, a process providing more sample points per second with the least voltage change per sample will yield a signal with lower transient intermodulation distortion.

A second distortion mechanism occurs with very small signal amplitude changes of about 5 to 20 millivolts represented by digital activities of less than about 8 bits in a typical 16 bit system. These levels seldom occur by themselves yet can still be a small but audible part of a larger low frequency dominated signal. Hence, these small signals can occur averaged at many different voltage levels or digital numbers of a larger slow waveform. A practical example of this would be midband hall reverberation decay and bass sounds combined. The reverberation signal attenuates and sometimes completely disappears as it becomes chopped or broken segment parts of the bass waveform. As previously indicated, these breaks represent the 150 uV resolution limits of a "perfect" 16 bit reproducer. In practice, very small signal changes can become stepped outputs, or more often distort to irregular step to step changes with an uncertainty or hysteresis which occurs due to errors within converters and from external interference and crosstalk. This produces a collapse of the sense of space in a recording and generates impulsive grainy noise effects which are usually made less objectionable by adding a random noise voltage to the signal prior to encoding so that the step errors become randomized from the uncertain samples created. Thus, the stepped or quantized distortion becomes a less objectionable noise modulation and the least bit signal cut-off levels are now smoothed to a gradual gain loss with progressively smaller signal changes. A better form of distortion reduction occurs by increasing the sample points per unit voltage change. Unfortunately, like the process to increase slew accuracy, a much higher digital information rate than that of the current standard is needed to accomplish this.

Low signal level digital errors produce distortions such as quantization noise and resolution loss. Whereas, high signal level high frequency and slew rate related errors produce distortions such as sporadic beats and fast signal change envelope related subharmonics, referred to as transient intermodulation distortion or TIM. One is easily misled by test signals with a continuous envelope nature, in that they tend to average over time and cancel many of these distortions and therefore incorrectly indicate only very small resolution and converter inaccuracy distortions. Unfortunately, waveforms like those in music continually change and, as noted, may provide much higher and far more objecti onable non-ha rmonic TIM and resolution problems.

Digital distortions occur with high slew rate and small amplitude signal change con ditions and, as previously indicated, both are not likely to occur at the same time. Hence, in accordance with the invention, the system identifies either a fast slew or a small change character of the signal waveform and implements the appropriate corrective process. During encoding, the nature of program signal changes can then determine which corrective process is used as well as a best reproduce conjugate or process at any time during decoding. One process can borrow information rate from a less needed performance capability when potentially severe distortion conditions in the sign al call for it. In this manner, a decision to provide more points per fast voltage change yields an equivalent higher sampling rate at the expense of less important low level resolution. Conversely, a smaller voltage change per sample automatically reduces the momentarily unneeded speed capability. Such interplay and compromise can be managed and/or computed to maintain a substantially constant digital information rate. Under these circumstances, the processed, decoded, analog output may have an apparent increase of bandwidth and resolution and, as noted earlier, when these improvements occur, one or the other as needed, the fundamental causes of digital distortions as well as their effect on imperfect reproducers can be reduced.

A similar correction strategy is applied to reduce filter trade-off compromise errors between transient response, phase accuracy, settling time, group delay, and other distortions inherent with filtering methods. Such errors may not be non-linear, and hence, will not appear as harmonic distortion; however human hearing is sensitive to manipulations of waveform shape and to the settling time of complex signals. Typically, the smallest amplitude high frequency signals are likely to have excessive transient ringing and process noises from aggressive filtering, whereas subharmonic beats and other filtering noises may occur with intense high frequency signals. The instantaneous versus non-instantaneous character of complex signals is reproduced differently from one filter type to another. As before, the same large signal/small signal selection criteria hold, allowing a best encode and decode filter choice, without having to compromise for the opposite, essentially non-coexistent, program conditions.

Hence, the method and apparatus of the present invention utilize a pre-calculated optimal interplay of gain, slew, filter selection, and waveform synthesis operations done individually or as a composite all inclusive process which becomes encoded and decoded in a complementary manner to reduce distortions and improve resolution. Included in such a system is a record compress-play expand system with some features similar in ways to those used in noise reduction systems. Most such noise reduction systems use either peak or RMS detectors to examine the incoming signal and convert its level to either fast or slowly changing internal DC control signals which ultimately drive a transient free switching element or an analog variable gain device. When set up for gain reduction, with increased input signal level, the output signal is compressed so that tiny signals are amplified and strong distortion prone signals are attenuated. Upon playback or decoding, a similar circuit set up for gain expansion, detects level changes and restores the signal to an approximation of its original dynamics.

In contrast to traditional noise reduction, the system of the present invention corrects distortion. It does this by altering gain structure, as well as amplitude and slew rate linearity, for extreme low and high level signal conditions. Low level, small changing parts of the signal are detected and used to control the gain of the whole signal which then includes more encoded bits. This gain control is derived from a broad middle spectrum of the signal and is active at signal levels representing the lowest levels perceived by human hearing. It is not activated by low frequencies, near supersonic frequencies, or when higher level mid-band signals are present. In this manner, the gain structure increase maintains a minimum LSB dither-like activity independent of inaudible sounds and maintains ambient and background information as well as masking quantization and monotonistic error distortions previously described.

Infrequent peak levels are instantly compressed with a transfer function having very low distortion for signals near maximum level and producing minimum upper harmonics once the limit threshold is traversed. This type of operation does create an occasional higher distortion on peaks, however it prevents catastrophic overloading during recording and allows a higher recording level with overall lower distortion.

Infrequent fast slew portions of the waveform can be expanded symmetrically in time, and/or in samples, to encompass more encoded bits, and, as before, other parts of the waveform may be unaltered. This operation may be a dispersion process where time delay is altered, or it can be a graphical waveform synthesis. It takes an instantaneous event and spreads it in time, and like the peak limiter, it creates distortion in undecoded playback.

Gain change, peak limit, and slew rate compression operations and their complements or restorative operations are practical with analog or digital techniques. Voltage controlled amplifiers, diodes, delay lines, and chirp filters, and multipliers are typical analog building blocks which can be assembled to create these functions. Equivalent digital sub-routines and dedicated process algorithms and components are also available. Distortion free digital processing is complex; for example, rounding off errors may have to be dithered and interpolated over time. However, once implemented, digital operations are very stable and precise compared to the variables subject to tolerances and adjustments required for the analog control of gain, dispersion, bandwidth and time constants.

The aforedescribed level and slew processes of the present invention correct distortions occurring from opposite signal conditions which are not likely to occur at the same time. Hence, these can interplay and at maximum correction capacity can borrow from an opposite less needed performance capability to maintain constant digital information rates. The wave synthesis process of the present invention operates with known distortion waveshapes which, when encountered during encoding, are subsequently called out of memory by code for complementary correction during reproduction.

Level and slew correction works for known signal conditions having unpredictable distortions and synthesis works for known distortions occurring from signal conditions unpredictable at the reproducer. Unlike even state-of-the-art noise reduction processes, this system's processing is under intelligent control and given sufficient computation, trial and error, or successive approximation time, the best correction scheme and its encoding for reproducer process control is readily determined and optimized.

Wave synthesis, in accordance with the invention, is a keyed operation used to recall from memory a number of predictable and/or recurrent distortions known to occur at the reproducer. Small waveform segments falling outside of the Nyquist sampling limits, repeated quantization distortions, and interpolation filter parameters can be recalled from a look-up table in memory or synthesized from information sent in the hidden code, and used for improved playback. The synthesis memory can carry several interpolation waveshapes which best connect points at and between samples. These larger waveforms will maintain their characteristic shape independent of level, just as the reproduced signal would do. Once the connecting waveshape has been recalled from ROM, it must be scaled to fit the signal. Since only very slowly changing waveforms will have samples without bit resolution levels in between, a form of level detection is necessary to make synthesized segments scaled to the signal. What would have been level detectors and gain controlled devices in an analog system are replaced by equivalent digital signal processing functions in a digital system. Once this has been accomplished, the reconstructed waveform has more equivalent data points in time and level and, when pre-computed properly, a lower distortion results from the curve fitting.

In light of the foregoing, a practical system, in accordance with the invention, may have many times better signal resolution and much better fast transient signal accuracy. A much greater digital information rate would normally be necessary to achieve these results. Data is saved by processing only distortion producing conditions. As noted, resolution is selectively and adaptively traded off for slew accuracy and slew rate or maximum level is borrowed for higher resolution. Information rate is conserved by toggling back and forth or fading from process to process when needed.

It should also be apparent that implementation of various subsystem designs may be in either analog or digital form, monitoring and analysis of the waveform may be accomplished at varying locations in the system including the reproducer and in either analog or digital form, other parameters of the waveforms may be selected for compensation, and control codes or other waveform corrective message information may be inserted and extracted in a variety of different ways, without departing from the basic concepts of the present invention.

Hence, the method and apparatus of the present invention for encoding/decoding signals with minimal distortion satisfies a long lasting need for a compatible system which provides an adaptive interplay of gain, slew rate, filter action and wave synthesis processes to substantially reduce signal distortions and improve apparent resolution.

The above and other objects and advantages of the invention will become apparent from the following more detailed description, when taken in conjunction with the accompanying drawings of illustrative embodiments.

DESCRIPTION OF THE DRAWINGS

FIGS. 7a through 7d graphically depict waveforms illustrating various types of distortion encountered with different types of filters;

DESCRIPTION OF THE PREFERRED EMBODIMENTS

The present invention is directed to a system for an electronic method and apparatus for signal encoding and decoding to provide ultra low distortion reproduction of analog signals, while remaining compatible with industry standardized signal playback apparatus not necessarily incorporating the decoding features of the invention. The improved system provides a selective interplay of gain, filter selection, slew rate and wave synthesis operations to reduce signal distortions and improve apparent resolution from a recorded product, under the control of concealed or silent control codes when necessary for triggering appropriate decoding signal reconstruction compensation based upon a previous signal waveform analysis made during the encoding process for the recorded product. In addition, signals lacking the encoding process features of the invention are likewise compatible with playback decoders which do embody the invention, and are provided the benefits of some overall enhancement based upon a signal waveform analysis made during playback.

Figure 1:
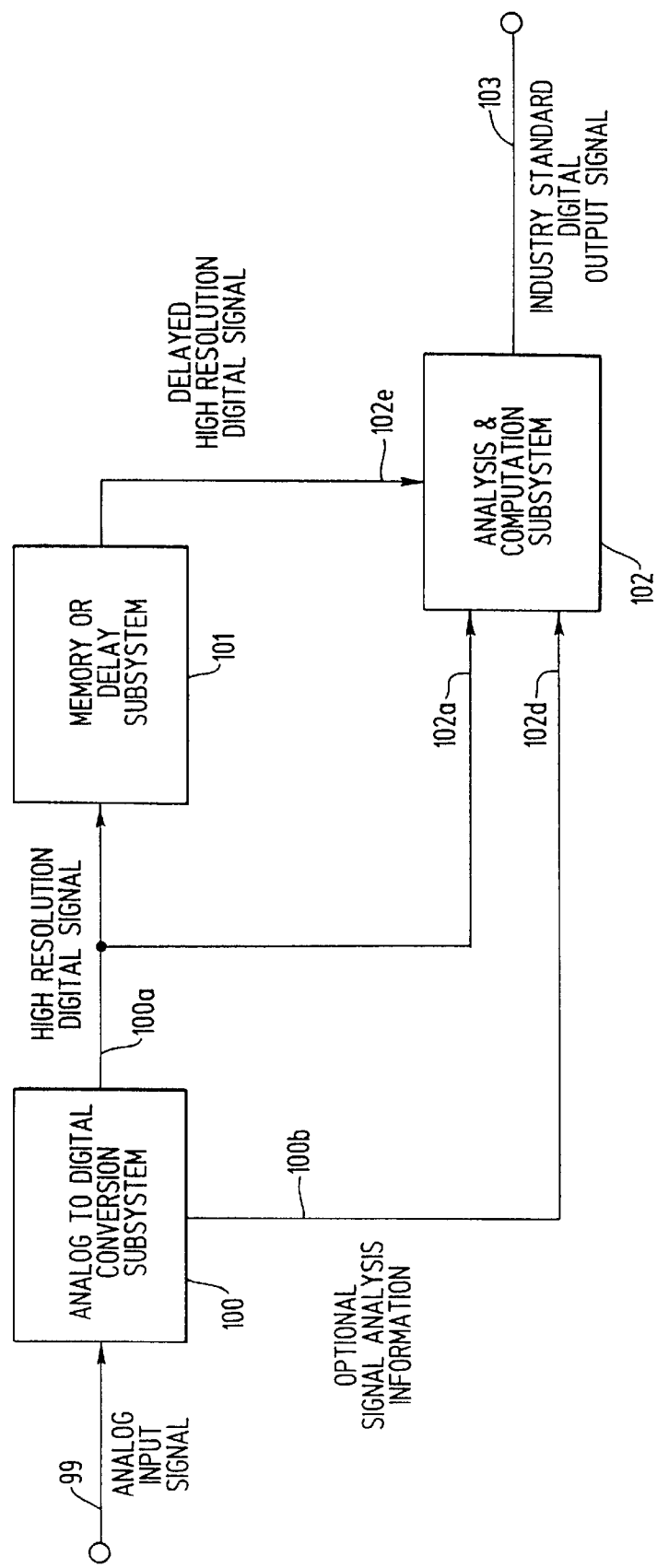
FIG. 1 is an overall block diagram of an analog to digital encoding system in accordance with the invention.

Referring now to the drawings, and more particularly to FIG. 1 thereof, there is shown, in general terms, the analog to digital conversion and encoding subsystem of a typical recording system embodying features of the present invention.

Figure 2:
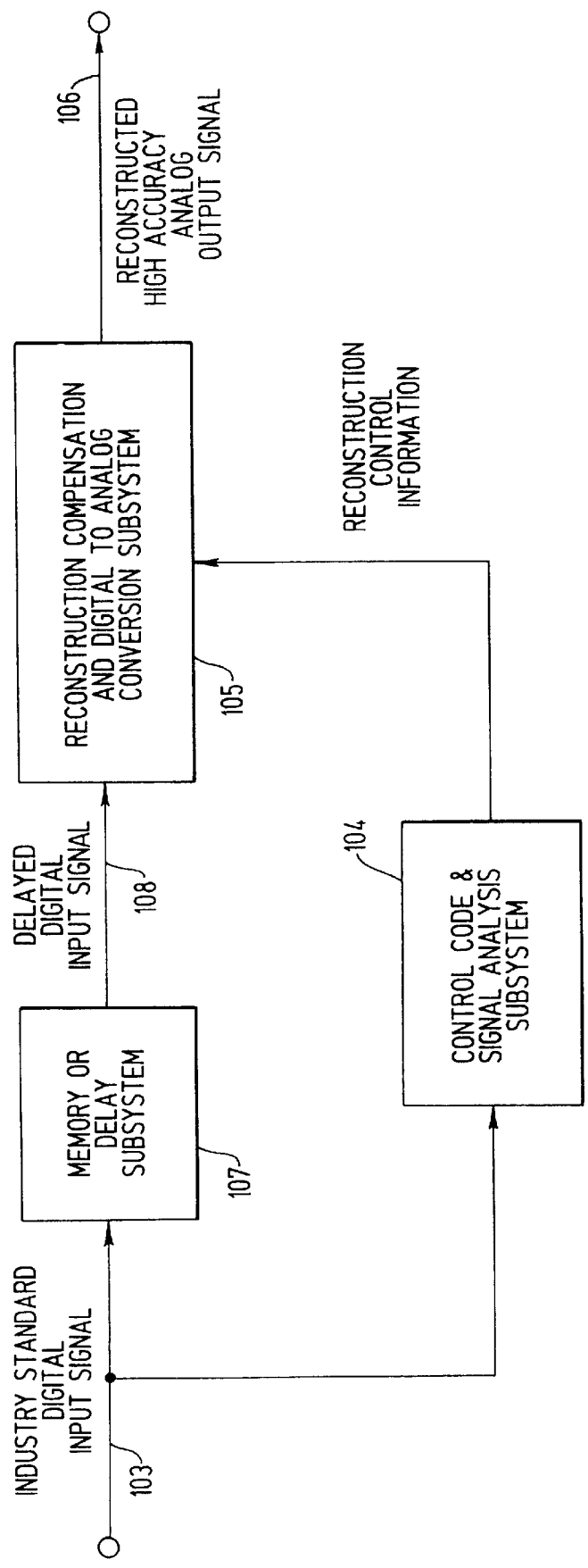
FIG. 2 is an overall block diagram of a digital to analog decoding and reproducing system in accordance with the invention.

As shown in FIG. 1, an analog signal 99 is directed as input to a processing subsystem 100 which converts the analog signal into digital form, including such tasks as filtering, sample and hold, analog to digital conversion and the like. The digital output 100a from the subsystem 100 is directed to two subsystems, a memory subsystem 101 and an analysis and computation subsystem 102. In memory subsystem 101, the digital signal is delayed or stored for further use and manipulation. The digital signal output of memory subsystem 101 is sent to subsystem 102 at input 102E. Using the output of subsystem 100 at input 102A, the waveform analysis and correction computation subsystem 102 continuously monitors and evaluates the digital format waveform as it is being stored in the memory subsystem 101 in order to determine the physical characteristics of the stored waveform ultimately to be reconstructed and the required corrections necessary for accurate reconstruction and restoration of the original analog waveform 99. This evaluation relates to reconstructive level, slew, and waveform synthesis requirements ultimately to be provided by complementary compensation in an appropriate decoding and signal reproduction system (FIG. 2). The evaluation may also predict alias components for subsequent conjugate neutralization. Some aspects of the signal evaluation may be performed on the analog signal by subsystem 100, and the results sent to subsystem 102 at input 102d.

The corrective procedures are applied to the digital signal from the memory subsystem 101 by subsystem 102 under the control of signals resulting from the analysis. The process controller 102 also generates control codes for use by the decoder which are converted to proper format and appropriately encrypted into the digital signal so that the control codes can silently ride along with the digital representation of the original analog waveform 99 and be provided as an encoded digital output 103. Some of these corrective procedures will relate, not just to distortion characteristics occurring as a result of the basic conversion of the analog waveform itself, but also to procedures deliberately introduced by the encoder for subsequent complementary decoding, such as peak limit/subsequently expand for high level signals and averaged compress/subsequently expand for low level signals.

As best observed in FIG. 2, there is shown, again in general terms to illustrate some of the basic overall concepts embodied in the present invention, a digital to analog conversion and decoding subsystem of a typical reproducing system embodying various features of the present invention for reconstructing the original analog waveform.

In FIG. 2, the encoded digital signal 103, recaptured from any appropriate recording medium (not shown) such as tape or disc, is directed as input to a digital signal analysis and processing subsystem 104 and to memory subsystem 107, which delays the digital signal. Signal analysis subsystem 104 extracts control code information inserted in the signal at the encoder and may also analyze the signal itself to determine its characteristics. These operations include appropriate means for control code detection, signal filtering, level detection, spectral analysis and the like. The detected control codes and signal analysis in the processing subsystem 104 are used to generate control signals directed to a reconstruction compensation subsystem 105 which interacts with the processing subsystem 104 and operates on the delayed digital input signal 108. Subsystem 105 includes digital to analog conversion, and may include further memory, such as one or more ROM's or look-up tables, for various types of reconstruction compensation used, in accordance with the invention, to correct the digital signal 103.

The compensation subsystem 105 typically will respond to the various control codes, or the absence thereof, to generate a variety of corrective compensations such as slew rate, level, filter selection, and waveform synthesis which, through appropriate interaction with the processing subsystem 104, yields a reconstructed analog signal 106 with minimal distortion and enhanced apparent resolution, all without the need for increasing industry standardized digital bandwidth.

It will be appreciated by those of ordinary skill in the art that the systems of FIGS. 1 and 2 are merely illustrative of simplified general approaches for practicing certain basic aspects of the present invention, and implementation of the systems of FIGS. 1 and 2 may take a wide variety of specific forms without in any way departing from the spirit and scope of the invention.

It should also be apparent that implementation of various subsystem designs may be in either analog or digital form, monitoring and analysis of the waveform may be accomplished at varying locations in the system and in either analog or digital form, other parameters of the waveforms may be selected for compensation, and control codes or other waveform corrective message information may be inserted and extracted in a variety of different ways, without departing from the basic concepts of the present invention.

Figure 3:
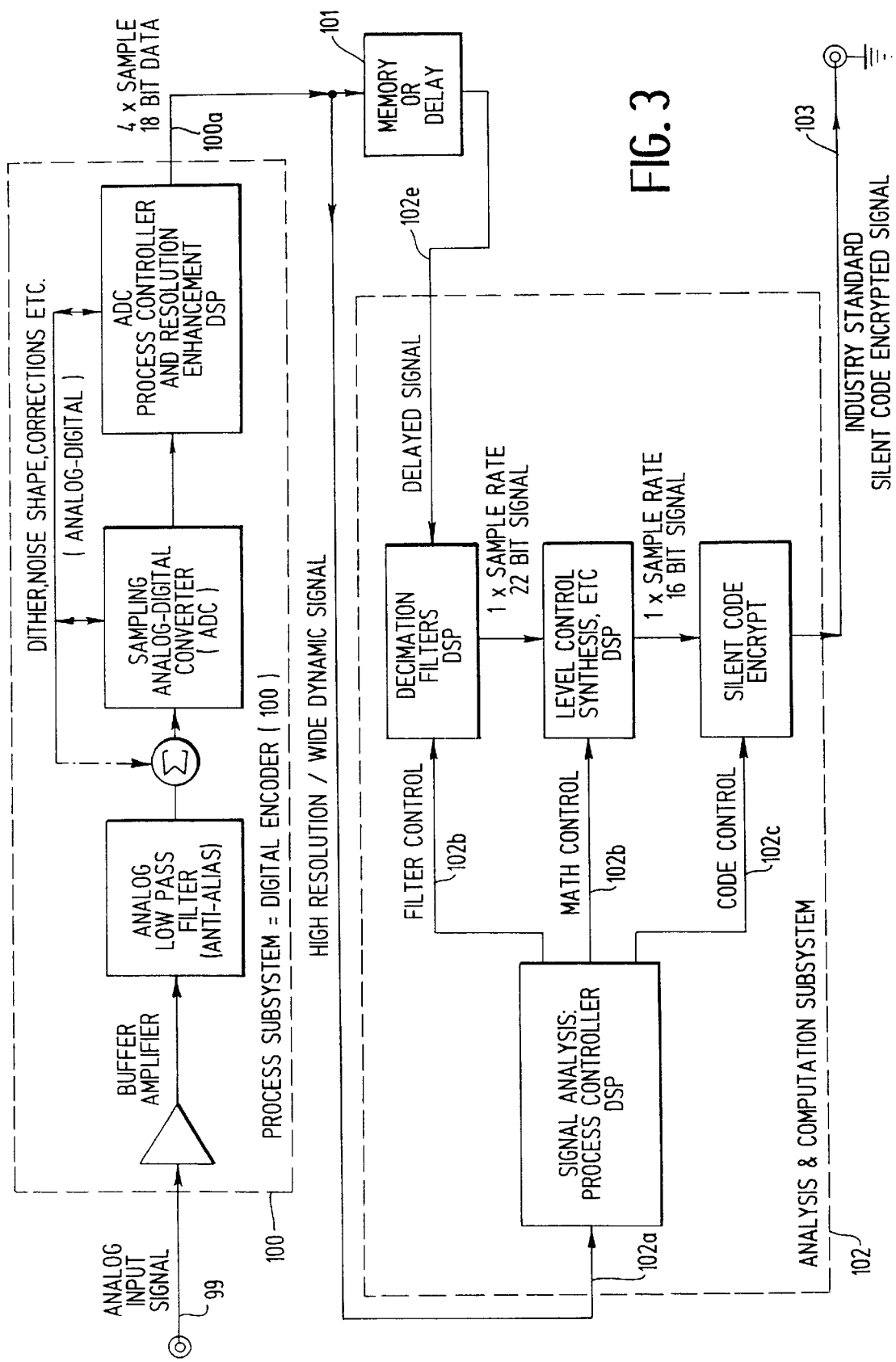
FIG. 3 is an more detailed block diagram of an example of an analog to digital encoding system in accordance with the invention.
Figure 4:
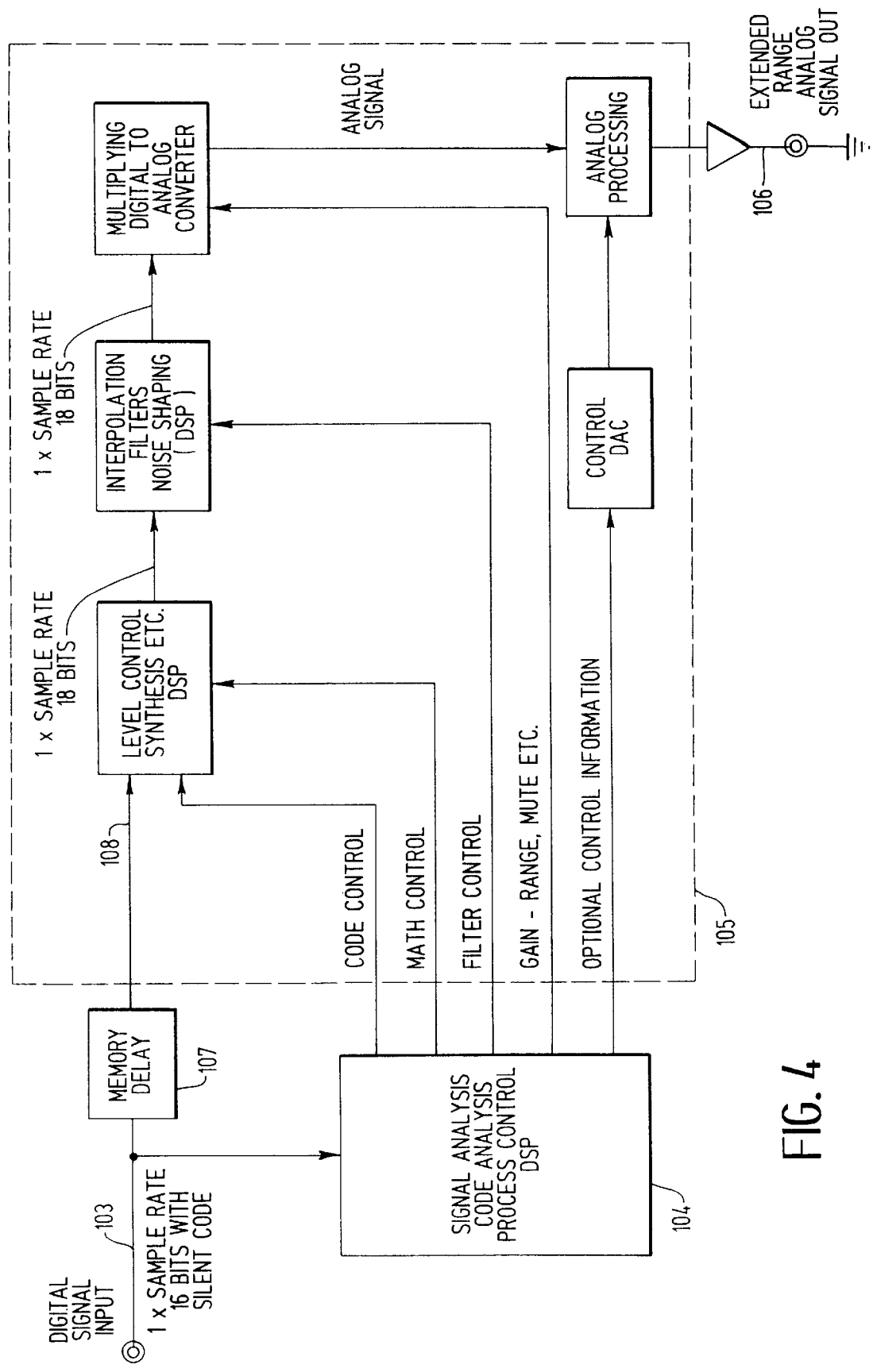
FIG. 4 is an more detailed block diagram of an example of a digital to analog decoding and reproducing system in accordance with the invention.
Figure 5A:
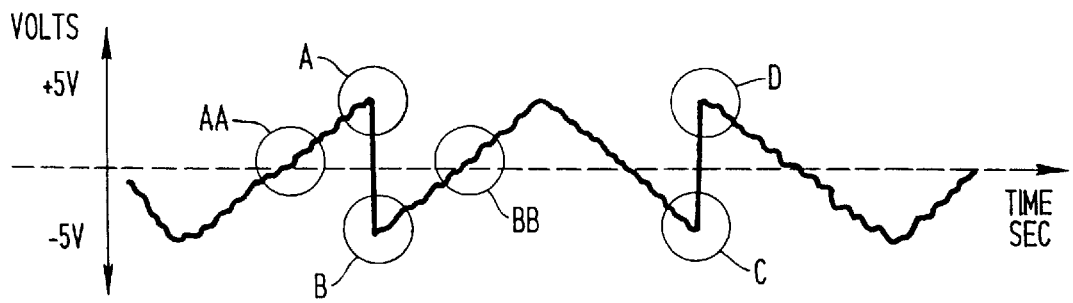
FIGS. 5a through 5e graphically depict waveforms illustrating sampling and encoding errors encountered with low level and rapidly changing waveforms.
Figure 5B:
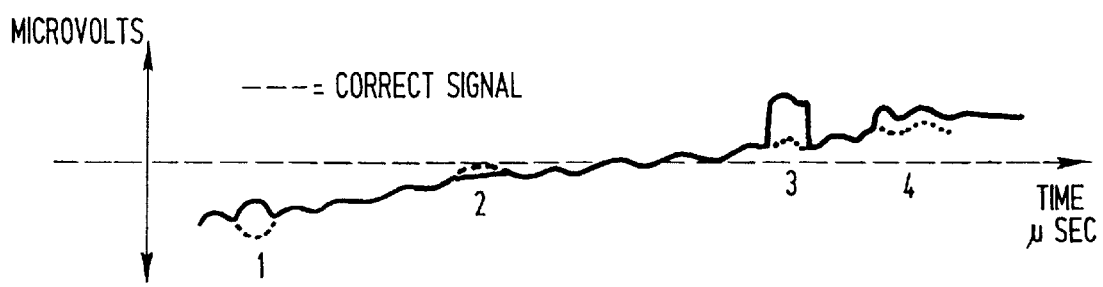
Figure 5C:
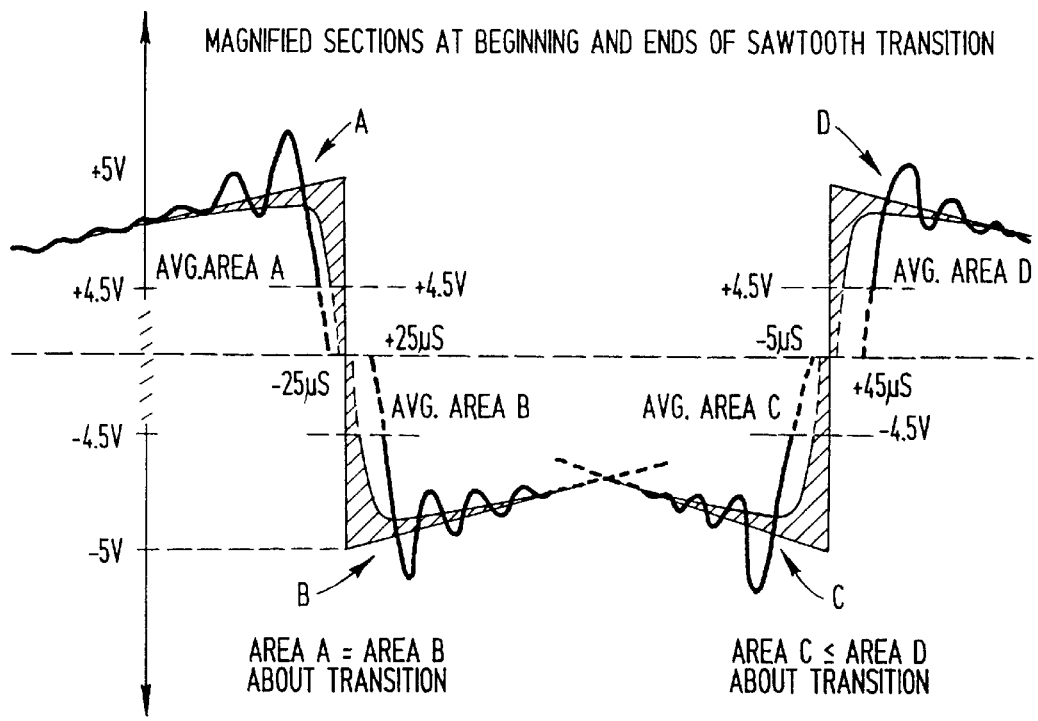
Figure 5D:
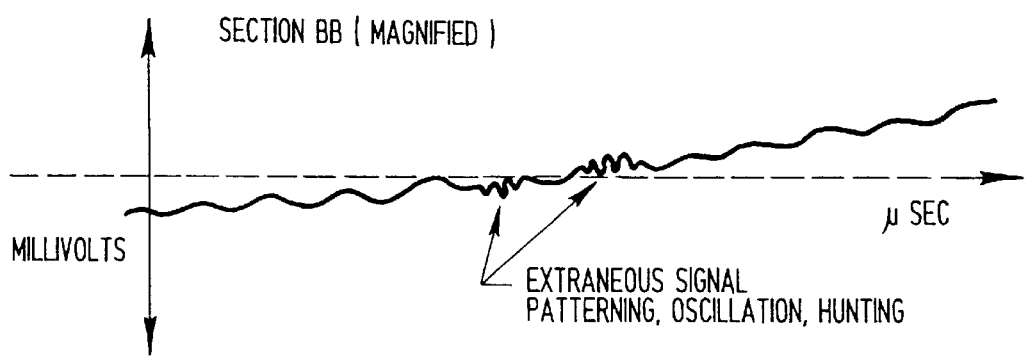
Figures 1, 5E:
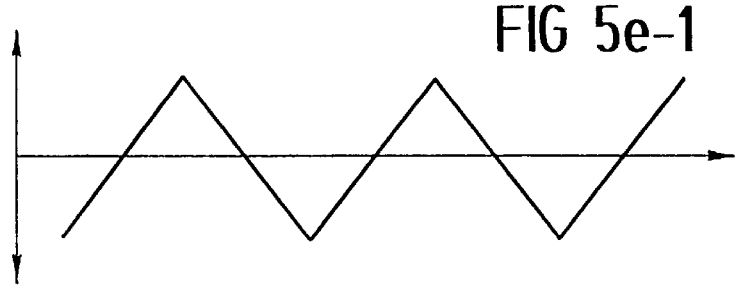
Figures 2, 5E:
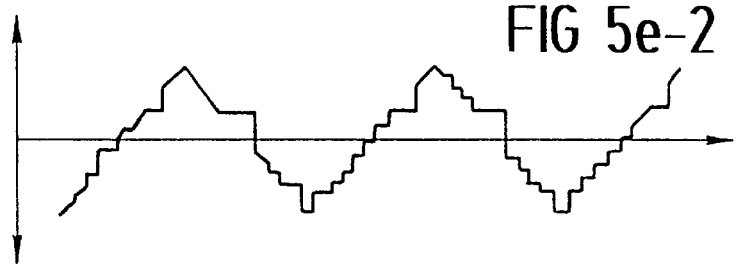
Figures 3, 5E:
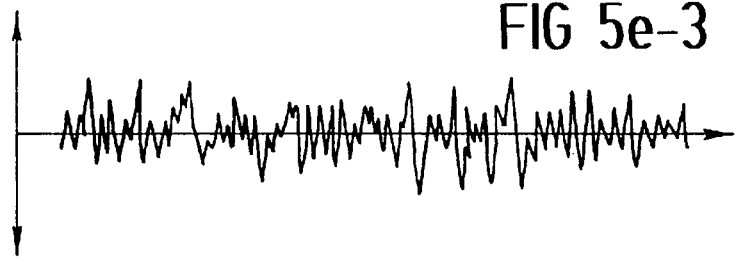
Figures 4, 5E:
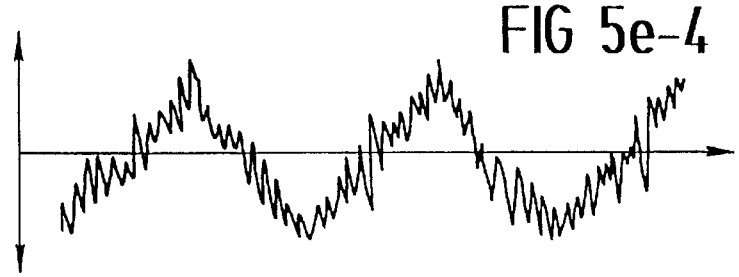
Figures 5, 5E:
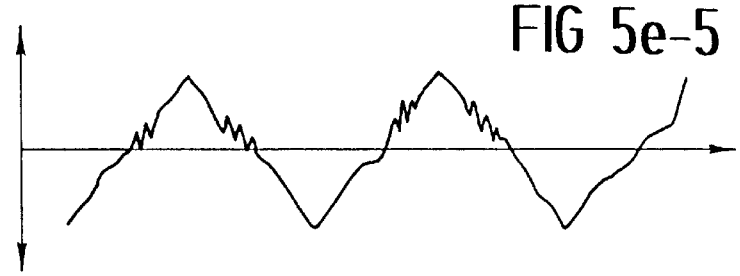
Figure 6A:
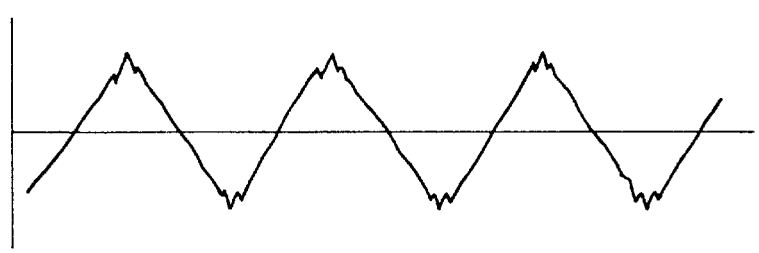
FIGS. 6a through 6f graphically depict various signal waveforms during the limiting and reconstruction of a triangle wave, in one embodiment of the invention.
Figure 6B:
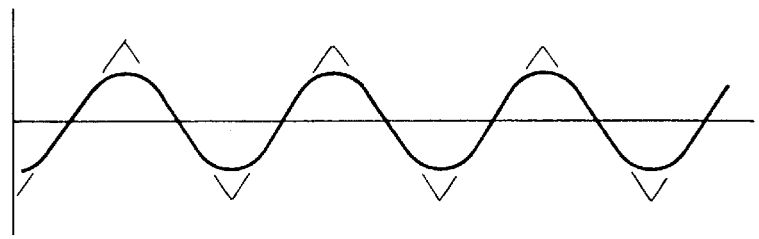
Figure 6C:
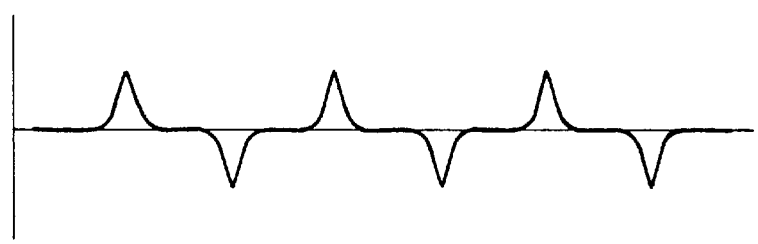
Figure 6D:
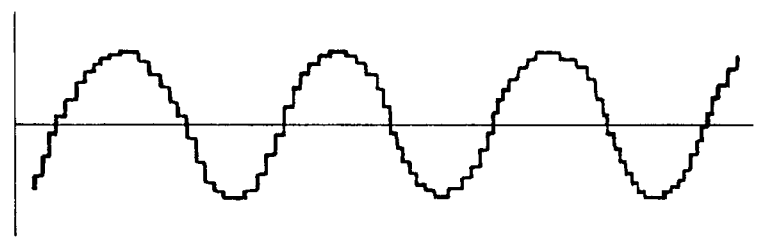
Figure 6E:
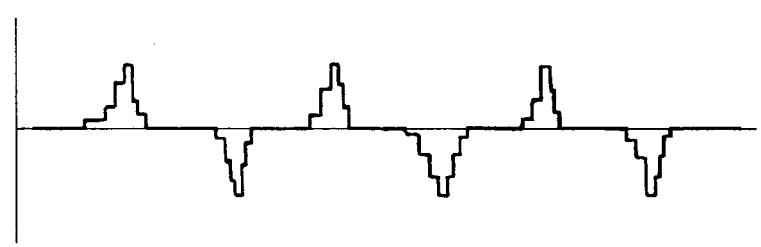
Figure 6F:
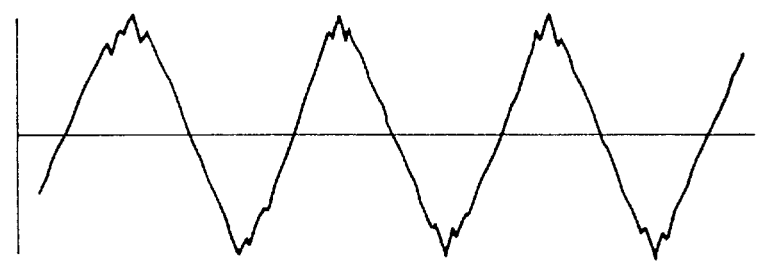

By way of example, one possible implementation of the general structure above is presented in more detail in FIGS. 3 and 4. These drawings correspond to FIGS. 1 and 2, and illustrate more internal detail.

Referring now more specifically to FIG. 3 of the drawings, there is shown an analog to digital encoding system in accordance with the invention. Analog input signal 99 is applied to a buffer amplifier, the first element of the analog to digital subsystem 100. The output of the buffer amplifier drives an analog low pass anti-alias filter, which removes any high frequency components of the input signal falling above the Nyquist limit of half the sampling frequency. The output of the low pass filter has an analog dither signal added to it and then it is applied to the input of a sampling analog to digital converter. In the converter, the signal amplitude is sampled at regular intervals and the amplitude of each sample is converted into a number or digital word. The series of digital words from the converter make up the digital signal, which is sent to the analog to digital conversion process controller. This process controller has generated the dither signal which was added to the analog signal before conversion, and, typically, the controller subtracts the dither from the digital signal, giving a vernier enhancement to the conversion accuracy as well as spreading any converter nonlinearities into a noise-like signal. The ADC process controller may also make other corrections or additions to the conversion process, such as noise shaping. The output of this module is a high resolution digital signal 100a which is sent to subsystems 101 and 102. It should be noted that this digital signal has both higher amplitude resolution and greater sampling rate or time domain resolution than the industry standard digital signal which is the final output of the encoding system.

Memory subsystem 101 is used to delay the high resolution digital signal 100a before sending it to 102e. This time delay gives subsystem 102 time to analyze the signal and choose appropriate corrective procedures to be applied during encoding.

The high resolution digital signal from subsystem 100 is also sent to the signal analysis process controller unit of subsystem 102 at input 102a. This unit analyzes the characteristics of the signal as it is being stored in the delay memory 101 and makes decisions about employing corrective procedures such as instantaneous peak amplitude limiting, low level gain compression, choice of best "brick wall" low pass filter, transient reconstruction and so forth. The unit then sends commands 102b to the units which process the delayed digital signal to carry out the corrective procedures. The signal analysis process controller also generates a control code 102c which it sends to the code encryption unit for addition to the output signal. This control code tells the decode system what has been done and how to recover an accurate representation of the original input signal.

The delayed high resolution digital signal from the memory subsystem 101 is sent to the decimation filter unit at 102e. Here, the oversampled input signal is decimated down to the industry standard sampling rate. The choice of optimal filter characteristics is dependent on the nature of the program signal at the time. Such factors as transient content of the signal, presence of large amounts of alias producing high frequencies, etc. are taken into account by the signal analysis process controller, and a filter control signal 102b tells the decimation filter which parameters to use. The output of the decimation filter has the industry standard sampling rate and very high amplitude resolution. It is sent to the level control processing unit.

The level control processing unit uses such operations as instantaneous peak level compression and low level average gain compression to squeeze the high amplitude resolution of the signal into the industry standard resolution (such as 16 bits for CD). These operations are done under the control of the signal analysis process controller. The level control unit may also include other techniques such as the addition of digital dither to allow resolution below the least significant bit level and transient time domain or slew rate compression. The output of this unit is sent to the silent code encryption unit.

The silent code encryption unit takes the control codes 102c from the signal analysis process controller, which are commands and information for the decoder system, and adds them to the digital signal. One method of doing this involves encrypting them into a pseudo-random noise-like signal and inserting it as needed into the least significant bit of the digital signal. Other methods include the use of "user" bits in standard code or unused bit combinations which may appear to be errors to a normal decoder. The common characteristic of these methods is that they provide a silent side channel for control information which rides along with the program digital signal.

The final task of the code encryption unit is to encode the composite digital signal into an industry standard format for recording, etc. The output of this unit is a standard digital signal 103, which, for instance, could be sent to a recorder. This completes the description of the encoding system.

Referring now to FIG. 4 of the drawings, there is shown an example of a digital to analog decode/reproduce system in accordance with the invention. The input digital signal 103, from a tape recorder, CD, etc., is applied to the signal and code analysis subsystem 104 and to memory subsystem 107.

Memory subsystem 107 provides a time delay for the digital input signal in order to allow subsystem 104 time to do its analysis. The delayed digital signal output 108 of the memory subsystem is sent to the level control unit of subsystem 105.

The digital input signal 103 is also applied to the signal analysis, code analysis and process control subsystem 104. This subsystem separates from the signal the silent control code inserted by the encoder. This control code contains information about what processing choices were made by the encoder and what complimentary corrections should be applied to reconstruct the most accurate reproduction of the original analog input signal. The subsystem may also analyze the signal itself to determine the best reconstruction strategy, measuring such parameters as the signal amplitude, spectral content, etc. The subsystem then generates a series of control signals to control the various units within the reconstruction processor 105, each of which performs a specific type of operation on the program signal.

The reconstruction compensation and digital to analog conversion subsystem 105 is made up of a number of processing units which operate on the program signal under the control of the analysis and process control subsystem 104. Each of these units has a control connection to 104. The first of these is the level control unit, which receives the delayed digital input signal 108. The level control unit performs amplitude scaling complementary to that performed by the encoder, such as instantaneous peak expansion and signal averaging based low level expansion. The output of this unit is a digital signal at the input sampling rate, but with higher amplitude resolution than the input. This output is sent to the interpolation filter unit.

The interpolation filter unit creates an oversampled digital signal by interpolating between the points represented by the input signal. The best filter parameters for this interpolation are chosen dynamically based on the control codes, and possibly also signal analysis, so that they complement the parameters of the decimation filter in the encoder. Other processing such as noise shaping and transient reconstruction may also be done by this unit. The output signal of this unit is a high resolution oversampled digital signal which is sent to the digital to analog converter unit.

The digital to analog converter (DAC) unit converts the high resolution digital signal into an analog signal. It may be a standard converter or a multiplying converter which is used to further effect level changes in the signal. The output of this unit is an analog signal which is sent to the analog processing unit.

The analog processing unit contains an analog interpolation filter and buffer amplifier. It may also contain other processing, such as level control, under the control of the analysis and process control unit. Since it is operating on an analog signal, the control signal may be converted to analog form in the control DAC before being applied here.

The output of the analog processing unit is an extended range analog signal 106, which is a close replica of the original analog input signal 99. The overall system of the invention makes possible a more accurate reconstruction of the original analog signal than would have been possible from conventional systems using the same digital recording standards.

The ensuing analyses and discussion are intended to provide further background for a proper understanding of the practice of the invention and to further illustrate and describe a variety of analog/digital modes presently contemplated as feasible for carrying out the invention.

Analog to digital encoding, in accordance with one aspect of the present invention, works as a sample rate down converter which allows resolution enhancement and reduced filter artifacts. Analog to digital conversion is made at a high sample rate and extended bit resolution, both well above that required for the final product encoded format. This high density code is then arithmetically processed back to the desired end use number of bits and sample rate. With this arrangement, many advantages occur. Analog "brick wall" low pass filtering is unnecessary as the very high ingoing sample rate allows much more gentle and phase-time domain controlled audio band cut off before Nyquist distortions occur. The sample and hold-analog to digital converter subassembly can be supersonically dithered in a known and controlled way to create duty cycle modulated low level code parts in which any monotonicity or missing code errors are spread out as noise sidebands around the dither signal. These will be very high frequency and, hence, almost inaudible, unlike signal related noises of standard systems.

An important advantage is that the "brick wall" low-pass filter required to prevent Nyquist-Alias errors can be implemented as a digital filter, which has highly reproducible characteristics free from phase distortions. The characteristics of this filter can be chosen dynamically based upon an analysis of the high resolution signal to minimize distortion. Hence major filter and analog to digital encode system problems such as pre-echo, transient ringing, group delay anomalies, missing code errors, alias distortion and beats are greatly reduced or eliminated.

A very powerful arithmetic "engine" and operating program, as well as digitally operated feedback and feedforward parts are utilized to make the wideband audio to selected format digital conversion. However, such a system also easily performs instantaneous high level limiting and averaged low level expand operations. In practice, approximately an extra 4 bits dynamic range can be had from systems having complementary playback and significantly improved sonics will occur from standard unprocessed compatible playback systems. This is because the recording engineer can raise levels without overload problems, thereby simplifying recording sessions and very low level ambient information will always maintain least bit activity to prevent monotonistic errors. Both processes on a "perfect" system would be inaudible. However, on real digital systems the sonics will improve, as the slightly higher levels reproduce with lower distortions through digital systems. Both the instantaneous peak limit/expand and the averaged compand/decompand functions are controlled so that the degree of processing can be computed and automatically controlled as needed for best program reproduction. This configuration allows very fast corrective action to be varied by a low bandwidth control signal. This control signal can be hidden within error correction codes, placed on other audio channels within the system, or random noise encrypted and inserted as needed into the least significant bit or bits. In this regard, the benefits far exceed any added error which is below the practical resolution limits of most equipment.

Basically, one aspect of the system of the present invention addresses and partially corrects several distortions known to occur with A to D and D to A conversions of complex signals. Some of these errors are hardware related and are correctable with more exacting methodology. Other distortions are the result of the bit depth and sampling rate fixed by industry standards and are minimized creatively by the system, by varying dynamic optimization between performance aspects. Determining the best form of optimization can be very complex, as many such distortions do not occur with the steady state type signals used for distortion tests, and must be minimized to subjective criteria. Most are transient intermodulation distortions (TIM) of which certain types are objectionable 50 to 60 dB below the program material. As will be shown, the hardware mechanisms for producing these distortions are non-linear switching and hysteresis in capacitors in sample and hold circuits, digital to analog crosstalk, slew rate asymmetry from large numbers of parts in the signal path and crosstalk between analog and digital signals.

The encoding process of the invention makes program signal alterations with the least audible consequence for reproduction from standard equipment. These changes reduce certain types of distortions and increase signal resolution, thus providing improved playback, e.g., better spatial sense and less brittleness. Using the decoding process of the invention, the reproducer can be made to track and inversely compensate these signal alterations thereby allowing substantially "exact" playback, with greatly reduced distortion.

In order to provide a further understanding of the problems with digital systems and how they are resolved by practice of the invention, the difficult technology areas and distortion mechanisms occurring from ideal as well as practical implementations are presented as follows:

1. Resolution limitations with small signals:

Distortions in digital systems increase with decreasing signal levels, and the smallest signals become broken and tend to disappear. A good analog system and a 16 bit digital system can both handle signals with an 85 dB dynamic range. Typical analog systems have infrequent high distortion at signal peaks whereas digital systems have continuous distortions at low levels. Experience has shown these distortions to be audible, hence some form of noise dithering is often used to smooth out quantization steps and allow information fill-in. This technique creates new distortion from beats between dither, sampling and signal frequency differences. Nearly inaudible low level upper harmonics then create more perceptible low level sub-harmonic interferences.

FIG. 5$a,b,d$

Sampled, encoded, and decoded low level low frequency signal.

FIG. 5$e$

Above dithered with high pass filtered random noise.

A unique solution to the aforedescribed problem is provided by the system of the present invention.

In this regard, a minimum low level signal activity is maintained at all times by using a gain expanding device or its equivalent digital process to increase the gain of the system only when the average level of the signal is low. This low level gain riding is programmed to maintain a minimum LSB dither-like activity which will tend to mask quantization effects or other least significant bit monotonistic discontinuities. The reproduced program will sound better on less expensive players not incorporating the invention, which often have high distortions from these kinds of problems. For exact decoding, the invention provides an opposite gain-structured average level compression device or equivalent digital process which restores the full dynamics of the original signal. When this complementary process is used at the reproducer, low level gain reduction occurs and quantization noise is reduced.

Best operation of the process occurs when gain control is based upon a broad middle audio spectrum, as this restriction prevents gain pumping from noise and bass fundamentals. An average level detector controls a variable gain function as follows: An RMS detector or other averaging type device receives these signals. Gain boost is determined from the band restricted program and its average boost level is controlled by attack, sustain and decay parameters much like those in synthesizers. To prevent overload from sudden signal changes, the unmodified full bandwidth program is delayed long enough to allow time constants needed for the averaging process to respond and anticipate events. The delayed program is then gain controlled either by adding the signal to itself or by multiplying. These methods provide the benefit of undecoded reproduction with the lease audible artifacts.

A decoding reproducer can operate in the aforedescribed manner except that it performs a gain reduction in response to its own determination of average signal level, using a control signal detected from a reduced bandwidth version of the input signal, having attack, sustain, and decay time constant averaging to operate a gain control process passing the delayed program. This default or non-controlled mode can be made sufficiently accurate since the recorder has the same building blocks and can test the reproducer response for a program event and make touch up corrections prior to the full band signal reaching the variable gain device.

This system operates like many compress/expand type systems. Various internal operations like filtering, detection, gain control, integration for time constants, time delays, log conversions, and curve generation can be made operable from functional modules or from known digital process programs. An analog system can be constructed from such building block functional units. Each unit is fully buffered, gain structured, and instrumented allowing many different types of systems to be set up easily. A more detailed description is found below as part of the circuit description.

2. Catastrophic overload from large signals:

Large signals can suddenly overload a digital system to create severe unmusical crackling and other breakup sounds. Most analog recorders gradually overload with program related harmonics, are more forgiving, and therefore work closer to their maximum capability. Recording engineers using digital equipment typically will choose more conservative levels and risk the resulting lower resolution and higher distortion.

FIG. 6a–f

Digital/Analog overload on triangle wave.

A unique solution to this problem is also provided by the system of the present invention.

In this regard, a peak limiter is used to imitate analog overload. Higher peak distortions occur infrequently, but now the average program level can be higher, and the average percent distortion is usually lower. Exact program reproduction is restored by a peak expansion having a conjugate transfer function to that used to limit the program. This peak limiting can be applied to the signal either in the analog domain, before it is converted to digital, or in the digital domain, and the conjugate expansion can likewise be applied in either domain. The preferred method is to do both operations in the digital domain, since the expansion can then be made to track the compression exactly, and the shape of the limiter curve can be controlled for least distortion on undecoded playback. In order to make the scheme work effectively in the digital domain, however, one must have an analog-to-digital and digital-to-analog converters with sufficient amplitude resolution to handle the dynamic range.

If the peak limiting operation is applied to analog signals at the encoder input it can be digitally conjugated to yield a linear signal of more data bits. This effectively creates an A-to-D converter with higher resolution which has higher errors for signal peaks where the diode compression occurs than for the majority of its dynamic range.

Building block or functional module circuits can be hooked up to perform the input and output analog operations. Voltage controlled amplifiers, four quadrant multipliers, log-exponential converters, and multiplying DAC systems are available. Most of these devices make a more logical and direct implementation, but they also have temperature tracking problems and most of them create higher noise and distortions than the method we use.

In the digital domain, DSP programs can work from lookup tables, arithmetic sub-routines, and process combinations. Just like low level averaging this operation can test decoder response, determine a fix, and then make the correction to a delayed data signal. Certain types of transient ringing occurring after decimation will create some re-construct distortion to very large signals. These errors are similar to those in other dynamic range enhancement systems. They appear to be an accepted compromise of dynamic range enhancement and for now we have not dealt with the problem.

3. Limitations of low pass anti-alias filters:

The industry standard low sampling rates force a very narrow transition region between pass and reject responses of anti-alias filters. This very greatly increases complexity of either analog or digital filter implementations and prevents having all aspects of filter performance optimal in one design. A compromise results. Best resolution for extended high frequency response and Nyquist rejection necessitate poor transient and time settling response. Less aggressive filtering gives less high frequency extension with improved transient settling or gives improved high frequencies and poor alias rejection. Filter sonics are different from one to another and each works best with certain types of program material. The filters shown below are symmetrical, fixed group delay types made from large numbers of sections representative of good finite impulse design practice.

FIG. 7b

Low Alias filter: extended maximally flat high frequency response, maximum alias rejection, steep transition region.

Electrical: Rapid changing high frequencies have unsymmetrical sidebands which create vestigial amplitude ripple effects. Long settling time for transients.

Sonics: Inner detail sound is compromised to get low alias distortion at high signal levels.

FIG. 7c

Compromise filter: Reduced high frequency response, larger transition region, reasonable Nyquist rejection.

Electrical: slower transient response with faster settling, less flat frequency response.

Sonics: Dull soft dynamics, moderate inner detail, moderately clean high frequencies—best for simple low level signals.

FIG. 7d
 High resolution filter; good transients, but peaked high frequencies and poor alias rejection.
 Electrical: High frequency response has a dip and then a peak, producing steep transients and fast transient settling time. Complementary decoding yields very fast transition speed to infrequent transient edges.
 Sonics: Best for complex signals when alias distortion does not create problems. Poor cymbal sound.

Near ideal digital or analog implementation of the above filters is theoretically possible. Both are characterized by similar equations. No one of the above works best for all situations; each has its compromises.

The aforedescribed problem is likewise resolved by the system of the present invention.

Observe the program data and dynamically choose a best encoding filter automatically, based on the program content. Send to the reproducer coded control signals indicating these filter choices. This makes it possible for the reproducer to initiate its own complementary or conjugate response to the encoding filter characteristics.

Filter corrections require an operational system consisting of encode filters, decode filters, selection logic, a means of switching from one filter to another, time delays, and a means of encoding control signals for the reproducer. Each of these can be performed in the analog or digital domain and quite often easy processes in one are quite difficult in the other. A brief description of each subsystem follows:

Digital Filters:

Complex filters are best created by specialized DSP chips. A typical DSP chip is configured with 24 bit multipliers and 56 bit accumulators in a functional configuration which is very efficient at performing the multiply and add operations required for digital filter algorithms. DSP chips can be used to make symmetrical finite impulse response filters, convolution networks, spectrum analyzers etc. In most instances, a filter equation is designed using a computer to simulate its response and the resulting coefficients are then incorporated into a program for insertion into the DSP chip's memory. PROM chips are programmed with these numbers and connected to the DSP, or for volume production an equivalent mask programmed ROM may be used, which may even be resident in the DSP chip. Hence, different filter responses can be achieved by changing to different program coefficients or different programs, all stored in ROM, or by using several separate DSP processors, each running a single filter program.

This approach applies to decimation, which reduces oversampled data to an "alias free" lower sampling rate and is used during encoding, or to interpolation, which produces an oversampled signal and may be used during-the decoding process. Both involve the use of low pass filters and both rely on multiple or oversamples of a base or industry standard sample rate.

Decimation takes a stepped "curve" of multiple samples for each one needed and finds the best number for each sample at the desired rate and discards the rest. Since waveform reversals within each final sample period do not reproduce and only create distortion because of the Nyquist limit, a low pass filter operation must remove the alias frequencies of such events, eliminating the audio consequences. In one system, we use a 16 bit converter operating at an 8 times oversample rate, and in another, an 18 bit converter operating at 4 times oversample rate. In theory we gain 2–3 bits from subtractive dither with oversampling and gain another two from limiting. During any one sample, hundreds of DSP operations on these bits will have been in process and accumulated to produce an encoded low pass filtered number 24 bits long. For our system, 20–22 of these bits can have useful information.

Interpolation takes each sample and creates a stepped "curve" of many computed intermediate values or oversamples. Here the intent is to reconstruct a waveform like the original signal. As before, hundreds of DSP operations are needed and again fully processed points between samples as well as any computed signal restorations become added bits to the DAC. With the system of the present invention, we then get 24 bits at an 8 times oversample rate. Of these 24 bits, approximately 20 bits contain useful information, and digital to analog converters with this resolution are just becoming commercially available.

Because of DAC performance limitations, it may be necessary to handle the added bits from limit restoration and low level averaging during or after digital to analog conversion. In one version of the system, an 18 bit 8X sampling DAC and noise shaping is used to achieve a theoretical 2–3 bit resolution improvement to the stepped curve interpolation.

Filter Selection Logic:

Best filter choices are made when program conditions reveal a compromise problem. Strong high frequencies, isolated fast transients, and continuous low levels encode best with specialized filters. Fortunately, each condition is easy to identify and each is most likely to occur by itself. Conditions such as loud or soft, continuous or broken, and strong treble are representative of those which are identifiable and cause problems. Program materials are not predictable and solo voice/instruments, synthesizer, percussion, and so forth may present rapidly changing requirements. Unfortunately, filter lengths, enhanced transients, filter merges, and identifying program conditions all operate with time constraints. Therefore, filter changes may have to be restricted when program conditions call for choices which alternate too rapidly.

A best compromise over time is made by memory enhanced variable threshold smart logic. Normally a filter "call" is initiated in response to a compromise situation. The call represents the intensity of the demand for a particular filter, caused by the compromise situation, integrated over a weighted time window. If the program doesn't change much and the call is not continuous and doesn't happen again, the previous best filter remains. Each successive call, its length of time and intensity increases the response sensitivity to engage that filter. If this choice is made, then the response sensitivity to engage any other filter is reduced over a preset time and the process like above now can repeat for a new filter. This selection method eliminates haphazard filter toggling and still allows quick filter changes when a strong filter compromise situation occurs.

Although this operation is suited for digital implementation, a hybrid analog and digital circuit is less complex and has allowed easy experimentation with programs. Diodes, resistors, capacitors, comparators, and current sources make up most of the adaptive decision making elements. Calls are voltages through resistors charging integrating capacitors. Call urgency translates to higher voltage for a longer time thereby increasing the capacitor charge rate and amount. Frequency of calls is the number of times this charging takes place. A filter select threshold is initiated when the capacitor voltage triggers a voltage comparator. To prevent indefinite sensitivity enhancement, a time slot for decision making is created by a negative going current source which eventually discharges the capacitor to reset conditions.

Each filter is engaged from a comparator as above. However, when triggering and a filter change occurs, all the integrating capacitors for the other filter choices are discharged and held inactive for a pre-determined setup and run time. Once completed the process resets and starts again without prior memory.

Program conditions are recognized with building block type analog circuits. High pass filters and peak detectors sort out alias causing high level upper frequencies. Peak and average level detectors are compared and the difference response integrated to identify transients. To reduce the influence of program level variations, voltage controlled amplifiers servoed from RMS detectors are used to scale the peak-average operation. Each of these circuit groups then produces a positive going averaged output voltage whose amplitude and time duration is related to the degree of filter compromise, or the desirability of choosing a particular filter type. Strong high frequencies, fast peaks at various program levels, and high overall average intensity all convert to similar filter call voltages, each proportional to the magnitude and repetitive nature of the program event.

Filter Switching and Merging:

Filters have different lengths, instantaneous phase shifts, time delays, responses etc. Simple brutal switching from one filter to another would create serious glitches, and other very audible disturbances. Some form of time alignment, fading and merging or a parametric change within the filter from one type to another is necessary. All of these techniques have been done in both analog and digital filter changing. Early light bulb photo-cell and VCA type fader-switchers are common analog methods. Many digital synthesizers use mix, merge and parametric filter changes in various combinations to produce inaudible transitions. Good examples are Fairlight and Synclavier machines which have elaborate digital tracking filters which work on these principles.

A simple implementation would use LED photocells and time delay correction to switch filters. For more advanced versions, the filters are implemented using DSP programs, and DSP programs are used to perform the mix, merge, and coefficient changing functions.

4. Frequency response limitations imposed by industry standard sampling rates:

The frequency response of digital systems is fundamentally limited to half of the sampling frequency, in accordance with the Nyquist theorem. For a current digital recording media, Compact Disc, this means that one cannot record anything above 22 kilohertz. This limit was chosen based on the assumption that the human ear cannot hear sounds above about 20 kilohertz. Recent research has shown, however, that humans use transient information in sounds with frequencies much higher than that to determine the direction from which the sound has come, and that eliminating those very high frequency components impairs ones ability to locate the source of the sound. The inner ear actually has nerve receptors for frequencies up to about 80 kiloHertz. Therefore, if the "brick wall" low-pass filter, which is a necessary part of all digital recording, removes frequencies above about 20 kilohertz in transients, it reduces the level of realism in the sonic image.

In accordance with the invention, the waveshape of critical transients is reconstructed at the reproducer based on information sent from the encoder over time. The steady state bandwidth of the digital channel is set by the industry standards, but, for occasional transient events, additional information on the shape of the waveform can be spread out in time and sent along for use by the decoder. There are a number of different methods which can be used to accomplish this, all of which make use of a control signal or "side channel" of information sent along with the main signal, described in more detail later. They are all non-linear processes and therefore should be used sparingly.

The methods of transient reconstruction employed fall into three categories:
  a. Waveform synthesis
  b. In-Between sample generation
  c. Slew rate compression All of these methods rely on starting with an accurate waveform of the transient resulting from an oversampled original signal which has the higher frequency information intact. In the waveform synthesis method, a transient to be reconstructed is identified at the encoder, and it's wave shape is matched to one of a number of predetermined "standard" transient shapes, which are known to both the encoder and decoder. A command code identifying the shape is sent through the control channel to the decoder, which regenerates the shape, either by reading it out of a lookup table or algorithmically generating it, and scales it to the amplitude of the bandlimited transient arriving in the main signal. The decoder then uses the synthesized waveshape to correct the shape of the transient and approximate the original. The correction can be in form of a difference between the band limited transient and the original, which is added to the band limited signal at the decoder. Obviously, only a limited number different corrections can be used, since one must be chosen in a reasonable time at the encoder, all of them must be remembered at both ends, tokens must be assigned to designate the choices, and time is required to synthesize and scale the correction at the decoder. Nevertheless, it is possible to achieve an apparent increase in available bandwidth with only a few shapes. This method has no compromise to the shape of the bandlimited signal except the presence of the control command, and therefore is not audible on non-decoded playback.

The in-between sample generation method is very similar to the above, except that instead of sending a token representing a remembered correction, the encoder sends the actual waveform correction over the control channel, spread out in time to accommodate the low bandwidth of the side channel. In it's simplest form, this correction can be the value of a single "in between" sample point falling between the normal samples of the band limited signal. The decoder can use this point to correct its interpolation of the signal as it generates an oversampled signal prior to conversion back to analog form. As above, the only effect on non-decoded playback is the presence of the control channel.

The slew rate compression method is different from the above two in that the additional information required to construct the transient is spread out in time and sent as part of the main signal. The control channel is used simply to activate the process. This method is conceptually similar to a technique used to enhance the apparent bandwidth of a video monitor during transients by slowing down the scan rate during the transient and speeding it up again to make up the lost time. When the slew rate, or rate of change, of the waveform exceeds a threshold, it is limited to a value which can be represented accurately in the band limited signal. The degree to which the speed is slowed down is scaled to the speed of the original transient so that the decoder can infer the original slew rate from the slow one which it can observe in the recorded signal and speed up again. Since the transient is spread out in time, the time must be made up somewhere, normally afterwards. In order work properly, the transient must be isolated so that information near it in time is not lost. This method definitely does have sonic consequences for undecoded playback, but analog tests indicate that a surprising amount of slew limiting can be done without being objectionable.

Dynamically controlled system:

All the above improvements are most effective when the reproduce decoder changes to complement conditions of the recorded program. The record encode process can generate a hidden control code concealed in noise as one method of controlling these activities. Random modulation of forbidden numbers in an error correction code or user code is another way that the control codes can be included with the program data. These can be continuous or initiated when needed. When the code hides in the program, digital copies from one format to another will preserve the code whereas analog copies will not. These features can identify unauthorized copies, as well as convey production process information that might be used for motion picture work, etc.

Algorithms and lookup tables in the decoder provide curvature shapes, time constants, level thresholds, multipliers, filter coefficients and other useful data also "known" by the encoder. Without continuous control information, the system can run default where the recorder/encoder is set up to anticipate the reproducer response. Either feedback from an internal test for best encoding or feedforward of a previously worked out response will do this. Most control activity is needed to access and change a particular complementary reproduce function or correction. Hence the improvement is much greater than the information bandwidth loss necessary to make the improvement.

5. Digital to analog and analog to digital cross-talk:

The smallest analog signals, in the 100 microvolt range and under, are easily contaminated or interfered with by digital data streams having millions of times greater energy. Faster processing increases the energy per bit as well as the number of interferences per second. The same situation occurs with larger numbers of bits. Interconnects, cables, and enclosures pick up this energy, store it, and create delayed compound interactions. Higher speeds require smaller packaging which increases such crosstalk, unless wires and other parts are also made smaller.

FIG. 5b

Analog waveform changes occurring from digital interaction.

FIG. 5c

Sample and encoding errors from rapidly changing waveforms.

FIG. 5d

Sample and encoding errors from low level waveforms. In accordance with the invention, a silent conversion system is used to resolve the above problem.

Normally a digital system operates with a continuous clock which times its internal operations. Millions of timed events occur each second. Hence the system state may change or be in a state of change at any moment, particularly the critical sample time when high accuracy is needed most. Sample time jitter and digital to analog crosstalk may result.

The system of the present invention stops all operations long enough before sampling to allow the energy stored on cables and other energy storage parts to dissipate. One pulse initiates sampling which then occurs during electrical silence. Once signal capture is complete, other processes resume.

A number of prior art approaches have been developed to reduce some of the above distortions and are described as follows:

1. Group delay of low pass filter accomplished by using an all pass phase shift network.
2. Quantization noise reduction from use of 1 or 2 least significant bits "keep alive" ultrasonic dither.
3. Reduced granularity noise from use of balanced or push pull circuits, achieving high common mode rejection of noise spikes and digital-analog crosstalk. Further reductions made with optical isolation of logic and converter systems, as well as high impedance isolated power supplies.
4. Slew induced errors reduced by super fast symmetrical analog circuits.

These improvements help reduce the harsh, congested sonics, and may slightly expand spatial sense in good recordings. However, inner detail and correct space perspective are still lost even with such prior art approaches.

Figure 8B:
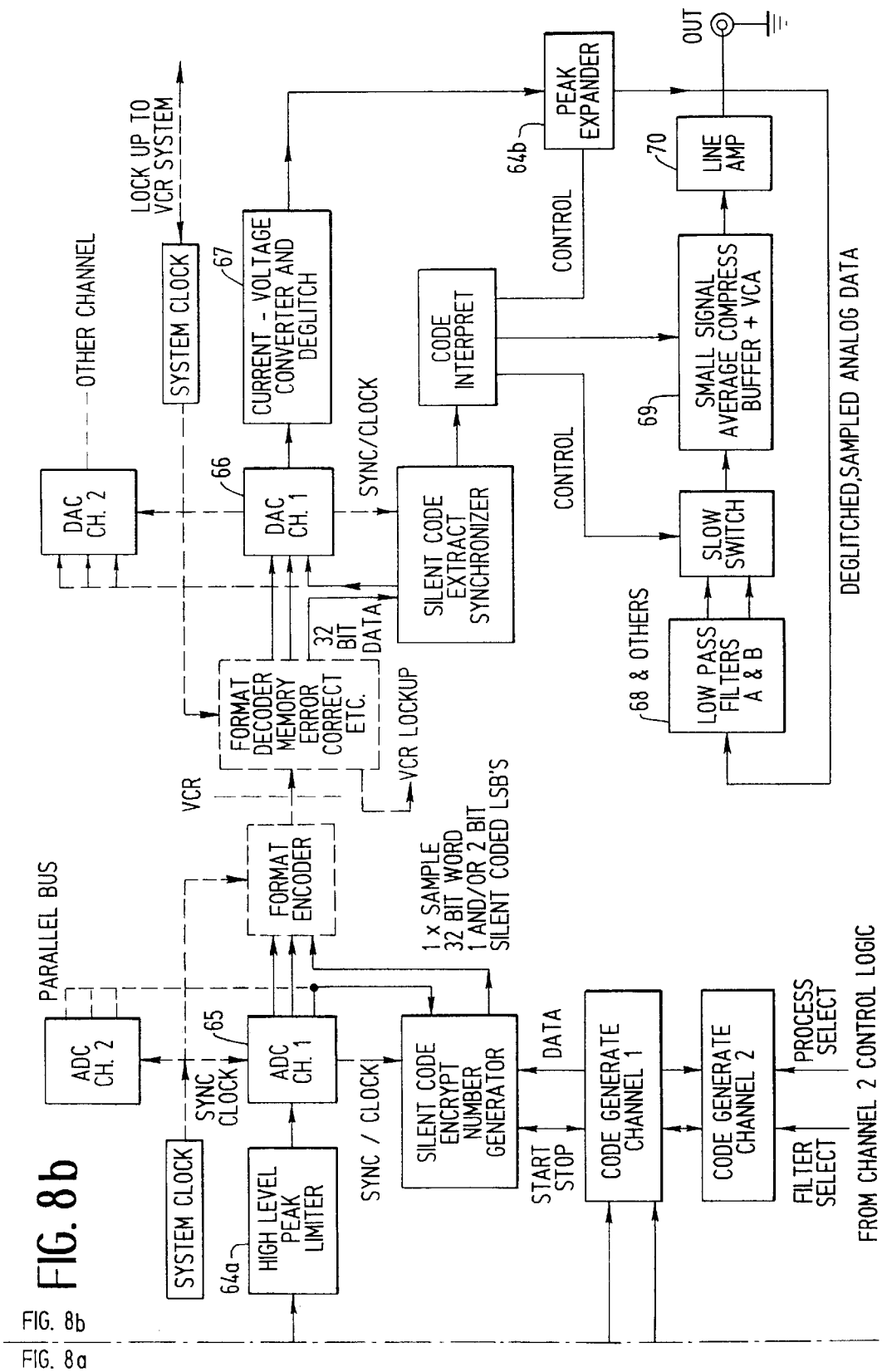
FIG. 8 is a block diagram of a processing system in accordance with the invention, using analog processing technology.

Referring now more particularly to FIG. 8 of the drawings, there is shown a processing system, in accordance with the invention. The system modifies signals to achieve 18 bit performance from a standard 16 bit converter system. As mentioned previously, the average level of very small signals is expanded while the occasional instantaneous peaks of very large signals are soft limited. When both operations are carefully done and are digitally encoded and then reproduced in a standard manner without decoding, the sound is improved. Ambience and articulation more like the original program does occur, even though the process would be audible without the intervening analog to digital and digital to analog conversion. By the time this expand limit process becomes clearly audible on standard equipment, the dynamic range for fully decoded reproduction in accordance with the invention has increased almost 20 dB. Average resolution is substantially more than 18 bits.

Each numbered subsystem element in FIG. 8 is an important stand alone operation typically performed by an independent circuit card or module. The corresponding schematic circuits for implementing the system of FIG. 8, while deemed to be within the design purview of one of ordinary skill in the art, are included for convenience in Appendices A, B and C included with this specification. These circuits are numbered to correspond to their respective block functions in FIG. 8.

The small signal average expand subsystem 61 operates in the following manner. The incoming audio signal is band restricted to 5 Hz to 500 kHz, thereby preventing DC level shifts, supersonics, and radio frequency components from overslewing amplifiers and influencing process control parameters. Components C1, L1, R1, C2 and R2 and buffer follower components J211 and J271 in Appendix A perform this inside-outside world isolation. Two active signal paths are provided, one passing through a voltage controlled amplifier (VCA and IC1) and the other originating from the buffer. Both signals are in phase, however, a control signal marked "compensation input" can set the VCA output from −40 dB to well above the buffered output.

Since VCA devices are well-known distortion producers, this configuration allows the clean buffered signal to pass uncontaminated when the VCA is shut-off at it's −40 dB gain. Only during very small signal conditions, when distortions are less important, is the VCA gain made large, allowing its substantial output signal to be added to the buffered signal. A higher overall output results. Remaining circuit components perform housekeeping functions necessary to prevent crosstalk between control signal and VCA output and to adjust for lowest distortions.

The phase shift network subsystem 62 operates as follows. The buffered and VCA signals summate or combine in phase at an attenuator R1 R2 R3 in Appendix A. With average program signals in the 0.05 to 0.5 volt (0 to −20 dB range), the VCA gain is set at −40 dB, making its output and distortions inconsequential to the accurate buffer signal. VCA gain increases substantially for small signals in the 0.005 and under (−40 to −80 dB range) where monotonicity and discrete step-by-step type quantization errors from the AD-DA process are becoming increasingly large. This added VCA output maintains a "keep alive" status or minimum bit number change rate at the A to D converter. Here the signal and its background noise become dither and a minimum useful amount of it is maintained by the variable gain VCA independent of signal conditions. Sometimes noise dither is added to digital systems and in practice this noise is quasi-audible. The active-dynamic dither has similar properties except that when needed, the original program dynamics can be restored with a controlled playback VCA system.

Four sections of all pass phase shift correction circuits and a second buffer are placed in the signal path. These stages marked A, B, are twice iterated. Each section of J557, J211 and J271 is connected to make a unity gain buffer-inverter giving in phase signals at R5 and 180 degrees out of phase signal at R4. Both signals combine through Ra and Ca making a flat response all pass system having near 0 degrees at low frequencies and 180 degree phase at high frequencies. The four combined sections still has flat frequency response yet exhibit an abrupt 720 degree phase shift in the 5 kHz to 30 kHz region. This corresponds to a 400 uSec group delay change which partially cancels a sudden group delay shift occurring with elliptical low pass filters. Without compensation, serious transient ringing would ripple modulate on and off the subsequent peak level limiter and would cause excessive gain modulation at the reproducer restoring or expanding the signal peaks. The group delay filter has very little ringing and allows much more predictable peak limit and expand operations.

The low pass filter subsystem 63 (701 filter) operates in the following manner. This is an essential and very troublesome part of all A to D converter systems. It stops or rejects frequencies near and above the Nyquist limit or ½ sampling rate. For idle systems, its "stopping: action must be better than the least bit resolution, while its pass action must be ripple free and in proper phase alignment in the 15 Hz to 20 kHz range. At 44.1 kHz sampling and 16 bit encoding for Compact Disk formats, the filter must drop at least 85 dB between the 20 kHz audio limit and the 22 kHz Nyquist limit. Mathematics of traditional filter designs require compromise decisions related to numbers of parts and their signal degradation, and alias, group delay, and ripple compromises. For the system of FIG. 8, a compromise of more parts for better transient and group delay is taken to allow better peak limit-expand operation. The delayed high frequency part of a sweep, which happens first, can add or subtract from lower frequency parts of the sweep happening later. Thus, the instantaneous frequency response can change with fast changing signals. Ripply beats throughout envelope and "tail" occur when such a sweep repeats back to highest frequency. A shortened envelope also occurs as delayed high frequencies of uncompensated filter occur within the sweep envelope. In this regard the delayed high frequencies continue ringing and internally reflect within the filter after the sweep envelope has completed and started the next cycle beginning well above the filter cut-off.

The high level peak limiter subsystem 64 (limiter, expander, dither generator) operates as follows. IC101 in Appendix A receives the filter output and completes transient response ripple compensation previously mentioned. Q1 and Q2 with IC 102B perform the peak limit function while Q3 and Q4 with IC 103 perform the restorative peak expand function at the reproducer. Added parts IC102A allow one to observe the signal waveform peak that has been limited and IC104 generated supersonic and near supersonic noise to dither the A to D conversion.

Completion of low pass filter compensation includes a combined notch-peak circuit around OP amp IC103. A tuning of 18.5 kHz high Q partial notch and a 21.5 kHz sharp peak become added filter sections which help smooth and reduce ringing. A rougher, but acceptable, frequency response is made and the peak transient ripple is less than 5% with completion the same as the square wave risetime.

Divider R1 and R2 sets gain structure and source impedance to idealized diodes made from transistors Q1 and Q2. These can be "supermatched" pairs having many devices random connected on IC substrate yielding near ideal junction performance. Circuit elements include simple transistors. These behave close to the ideal logarithmic junction relationship of:

$$V_1 - V_2 = \frac{kT}{q} \log_n \frac{I_1}{I_2}$$

giving change of forward voltage to operating current ratio. Boltzman constant; temperature, and electron charge are considered constant. Instantaneous resistance of dV/dI (rate of change of voltage to current) becomes related to 1/current once limiting action begins. This relationship tracks over a 40 dB (100 times) range for reasonably good transistors thereby allowing easy record-play peak signal tracking in the 10 dB one to two bit process range. A practical setting is a 2.4 volt peak to peak triangle wave compressed to 1.2 v peak through Q1, Q2 yielding a 3.5 v pp output at IC102B. This 1 bit (6 dB) compression can be monitored at "test" output showing the clipped portion which for set-up adjustment is made symmetrical with the 50 k ohm control. Restorative operation is demonstrated by connecting IC102 out to IC106 in. Observations at IC103 "protect" output shows tracking ranges in excess of 20 dB when needed.

Operation of the analog to digital conversion subsystem 65 and digital to analog subsystem 66 is as follows: output reconstruction from the D to A signal must occur prior to the low pass filter subsystem 68, otherwise phase shifts would alter the signal waveshape and consequent expand threshold points. Consequent sampling feedthrough currents, and interferences as well as step sampled date require fast circuits. Amplifiers have additional stabilization and speed enhancement. Components marked Rs Cs perform these operations and are specific to the amplifier types used. With decoded step waveforms, the limiter function must quickly settle to each level and associated amplifiers must not overshoot, ring, or have unsymmetrical rise and fall times while doing this. As noted, limit-expand functions must occur at direct coupled or DC pass circuits not having phase shift. A to D inputs and D to A outputs satisfy these requirements when the low pass filters are not included in the path. In practice, limiting will create upper harmonics in the Nyquist range which could create alias noise which would confuse reproduce reconstruction and add considerable distortion. Fortunately, practical operation allows modest compression and expansion of occasional peaks which happen in music and speech program material. Unlike instrumentation signals of constant amplitude maximum energy to band edge character, upper music frequencies are usually harmonics of less energy than fundamental tones. Alias foldover is then infrequent and occurs only at peaks which best mask these problems. FIGS. 6a–6f show various signal waveforms during the limiting and reconstruction of an illustrative triangle wave.

The low pass filter subsystem 68 operates in the following manner. The peak reconstructed sampled D to A signal output of IC103 is routed to a simple low pass filter. The 44.1 kHz and up step components are removed and the waveform is rounded and smoothed inherent to the filter characteristic. Noise and transient spikes are reduced to tolerable levels to prevent overslewing the VCA portions of the low level signal compress circuits to follow.

Operation of the small signal average compress buffer and VCA subsystem 69 and Line Amplifier Subsystem 70 (small signal compress, line drive) is as follows: Both subsystems serve similar functions to their subsystems 61 and 62 counterparts in the record section. Buffered and VCA output voltages are similar. However, this time the VCA output is subtracted. As before, lower distortion is achieved by operating the VCA at −30 to −40 dB level relative to normal level signals. The output line amplifier is connected at differential input single ended output. Increased VCA gains reduce signal outputs until at +10 dB, a null or 0 signal maximum compression occurs. With this arrangement, any reasonable signal expansion can be compensated and the system distortion is lowest for the most probable average level signal conditions.

Control signal generation is accomplished by the limiter-buffer subsystem 71, bandpass filter 72a and RMS detector subsystem 72b and gain subsystem 73. High level peak limit-expand thresholds and low level average gain set controls are needed. Circuit settings allow both types of control to be tested independently of each other. Best operation occurs when the control signal anticipates the program waveform to be processed and, hence, an audio pre-delay is used to allow control stabilization prior to circuit action. Low control bandwidth is needed to minimize non-signal least bit activity. One method of doing this is to have active-inactive control status. Since high level-low level program signals do not occur simultaneously, the reproducer can make its own decisions as to where the control is applied. The unused operation then returns to its inactive or nominal process state. High level, normal program type signals, where expand-compress functions are unnecessary, then have inactive control status. As signal levels decrease, an internal limit diode/clamp releases and the VCA gain rapidly increases to create summation signals.

Further program level reductions modulate the VCA gain in a controllable, predictable manner needed to maintain digital "keep alive" LSB (least significant bit) activity. For most conditions, these lowest level signals will be mid-band acoustic noises and numerous types of electrical noises. The latter may include RF interference, light dimmer pulses, security system signals, and high frequency peaked electronic noises. These often have low audibility compared to midband acoustic sounds. Hence, a sharp cut-off bandpass filter and very wide peak to average level capability RMS detector are used to assure that the. control signal tracks audio sounds and not inaudible interference.

In the small signal average expand subsystem 61, to handle the entire large dynamic range of modern program materials would require very low noise filters and detectors of quite difficult electronic design. Since the average level circuits are low program level active only, the process gain can be very high. This allows reasonable circuit voltages to occur during quiet passages. Strong signals normally creating overload are smooth limited with a semi-logarithmic curve to create minimal compression harmonics. Noise, transients, and other uncontrolled overload behavior are then prevented from crosstalking to the signal path. Component IC1 is configured as approximately 100 times small signal unity gain. Successive diode conduction with increasing voltage until the stage has less than unity under signals and maximum output rarely exceeds 6 v peak to peak at maximum program levels.

The bandpass filter subsystem 72a prevents low level inaudible electronic noises from modulating the average low level process. The breadboard part covers a 200 Hz to 5 kHz range and is made from two sections of active combined low pass high pass feedback type filters. These have a slight rise at band edge frequencies followed by a near 24 dB per octave cut-off. Note, that a front end buffer (J211 and J271) prevent filter impedance loading from interacting with input signals.

The filter output drives an RMS detector module, a DBX-type component having an averaged DC logarithmic output relative to AC input. As configured, a 100 mV output change occurs for each 20 dB input signal change. This gain structure from the limiter and filter through the converter gives 100 mV control range with very little noise for the millivolt type signals occurring at least bit resolution limits. Levels on either side of this represent front end electronics noise and normal signal operation.

Normal compressor-expander compromises are employed to assure minimal VCA gain modulation (distortion) from AC components in the control signal. Components C1, R1 perform this response averaging for the turn-off time constant. A much shorter turn-on time constant from the RMS module internal impedance and C1 occurs to allow fastest response to sudden program level increases. The short-long time constant action is typical of compand systems and because of low frequency distortion requirements, is set very long. (20 msec on, 500 mSec. off for 20 dB gain change) This very slow response necessitates input signal delay to allow control signal buildup before sudden signals occur when VCA gain is maximum at low level signals. In practice, the delay adds considerable distortion, and would not be used in its analog form in high quality systems.

Digital processors can perform all of the above level limits, band restriction and detection. The needed time delays to get best performance are simple, first in first out type, operations. Two advantages of long constant operations occur. Low frequency distortion is reduced and control signal bandwidth is much less, thereby reducing the amount of bit borrowing needed to pass the control through the audio encoding.

The DC offset and gain adjust subsystem 73 is the control signal amplitude, offset, and limit nerve center. It adjusts for tolerances between amplifiers, delay lines, VCA's and the RMS detector and, hence, performs general circuit housekeeping functions. It also is a limiter to give maximum and minimum VCA gains needed to implement the control signal inactive and minimum input signal presets.

For system considerations, both VCA's and the RMS detector operate with logarithmic control to signal and signal to control relationships. Hence, changing an offset changes a fixed program gain in dB. This makes possible large dynamic range gain control and yet still maintains low level signal control. Both can occur with reasonable control signal limits. In addition, control system gain changes, such as limiting, give direct dB to voltage gain ratios making very simple compress-expand ratios and assuring input-output tracking by simple polarity reversal of the control signal.

The offset gain adjust circuit inverts the control signal for input output tracking, adjusts DC offset of each to match gains at a pre-determined control signal level, and has control gain adjusts to make program level increases match reproducer gain decrease for varying control levels. Diodes CR1 and CR2 perform level limits to preset a maximum practical expand ratio and a maximum compress ratio under playback. As constructed and configured, this circuit has compress-expand ratio adjustment interactive on a single control and the threshold of when the process starts on a second control. Since these are DC level of dB operators, process control signals to these points will create dynamic process changes. At present, this is a manual adjustment. However, the process start level can be change dependent on program activity and other considerations to reduce audibility with normal non-process playback.

The delay line subsystem 74a&b is a balanced DC coupled self-clocking variable delay line. Charge coupled devices are operated push pull with staggered clocking to make the lowest possible DC drift, distortion, and clock noise from relatively poor performance devices. DC to 25 kHz minimum overshoot, 80 dB dynamics are achieved.

One delay 74a is used to allow control signal stabilization to prevent VCA overload from sudden signal changes. This delay also allows anticipatory process control signal strategy to be computed. A second line 74b is for test purposes when using a system without the hidden code subsystem to match the A to D and D to A encode-decode process time to make output signals track inputs. Bit borrowing, in which the control signal is noise encrypted and hidden in the least significant bit or bits of the digital signal, is the normal mode of operation of the system.

Limiter dynamic control via VCA input/output tracking can be had at high signal levels by removing the limiter-buffer subsystem 71 and operating the system as a straight compressor-expander. Since the peak limiter-expander is within this system, its operation is changed along with the gain variation programmed with the offset gain adjust subsystem 73. As noted before, a process control input can be operated so that all times when signals are loud, a certain percentage of limiting takes place. This is program dependent as some classical music will have infrequent peaks while studio processed rock and roll is more likely hard limited and will have many small peaks occurring frequently. Although this threshold control may be accomplished manually, numerous computed variations will work more effectively to keep the process least audible when reproduced on a standard non-restoring player, just as in the case of the low level process dynamic control. As with the average level expand-compand, the limit expand threshold control need only be very low bandwidth. A 10 Hz control bandwidth is adequate and since only one operation occurs at a time, only one control for both operations is needed. The player can determine program level and switch functions. In the illustrative system described, the control is manual since each operation is a different set-up. However, there is no foreseeable difficulty in making this automatic if duplicate VCA's were set up for limiter gain structuring.

The following further describes the theory, design concepts, and early development, construction and operation of an encode-decode system demonstrating the basic principles of the present invention. Its operation is analogous to the reconstruct process based on choosing optimal curve fitting techniques to get best waveform reconstruction. As described, the process changes for different signal conditions and the number of such process optimizations per unit time can range from a few per program to many times per second. Even faster operation changes are possible. However, the control signal needed to access the proper operational program becomes more complex and bandwidth consuming.

The basic system contains two record processors and two decode processors, each of which is complementary to and matching as a system. Either system is selected automatically by variable resistance photoconductive cells working as slow faders in the signal path. Light emitting diodes illuminate these cells and are driven by variable level control signals emanating from a signal analysis logic circuit. During operation, the logic chooses the least distortion process based on signal conditions. Similar switching and routing can be accomplished with voltage controlled amplifiers, digital attenuators, and field effect devices or other components acting on the analog signal. Similar routing, mixing, or merging operations can be made from digital processors operating on numbers representing the signal. Such operations like those with the photoconductive cells can be transient disturbance free by virtue of their slow switching action. Each record process, and its complementary reproduce process resembles a filter-equalizer operation which is made optimum for the program signal. Both parts operate as a system so that the encoder can anticipate reproduce errors and can create complementary corrections. In this manner, the record and reproduce circuits are not working as an individual, stand-alone theoretical ideal, rather as an optimal system. The breadboard design has two such systems, one for best articulation and transient response and the other for lowest distortion.

Filters, equalizers and curve fitting operations are accomplished as follows. One can define a filter mathematically by coefficient strings in polynomial sequences. In addition, the same filter can be defined by how it responds to a given waveform stimulus. Essentially, curve fitting in time, frequency domain, and amplitude is created from numbers which can be stored in tables. For analog systems, such operations are performed by circuit elements connected to band restrict, equalize, time correct, and to perform dispersion operations on a signal. These circuits can also be analyzed back to similar polynomial coefficients which can run as digital process programs. As can be seen, very awkward circuit construction problems occur when one must alter these numbers from time to time, as would happen with a dynamically changing process. multiple component values of inductors, resistors and capacitors, as well as gain stages, would be all simultaneously changing to produce such a merge operation. This can, however, be accomplished by digital programs. Dynamically changing digital filters have become practical only recently as the necessary processing power has become economically available. Of course, simple networks such voltage controlled parametric equalizers and variable RC section tone controls have been available for a long time. However, complex variable filters are still rare. As one can see, the dynamically changing curve fitting operations can be handled most directly by digital processing. In an analog system complete filters must be changed, whereas the digital process merely changes filtering. Both have similar potential curve fitting capability, however, they differ during the transition region from one process to another.

In theory, only one set of filter coefficients is needed to make a near ideal analog to digital conversion and its reciprocal, provided all signal activity in the frequency domain is greatly removed from the Nyquist sample limit and there are ample numbers to characterize the signal. Commercial digital standards do not allow either of these conditions and, consequently, some practical state-of-the-art compromise of time, transient, alias, quantization, and flatness of response must be made. The best of each performance aspect cannot occur simultaneously and one of ordinary skill must choose a compromise based on knowledge and subjective experience with audio programs.

As previously indicated, the signal to noise ratio of digital processes can be excellent while complex distortions at average signal level can be higher than with good analog systems. For high quality work, there is a need for improved resolution, time and transient accuracy as well as reduced high order distortion. This aspect of the encode-decode system, in accordance with the present invention, addresses such a need.

At this point, a further understanding of digital distortions will prove useful. Typical digital systems have between 0.01 and 0.05% total harmonic distortion (THD) at high signal levels and about 10% cumulative errors in the time-transient domain. Most analog systems have opposite problems to these, as they often operate at above 1% THD but seldom have more than 0.1% transient time error. Under low to average signal conditions, digital THD increases while analog THD decreases. As noted, digital distortions tend to be upper order and non-harmonic and, therefore, stand out due to their non-musical nature. Analog distortions occur less frequently and are less objectionable, even at higher levels, as they tend to blend in or musically merge with the signal. Similar problems occur with transient time domain type distortions. At first, it was thought such problems were inaudible, since simple square wave tests would show few sonic consequences from such distortions. Today, we can show serious deterioration of spatial sense, as well as lost inner detail perception as a result. As digital time domain distortion is much more complex than the simple ringing measured in early tests, resolution performance of industry standard 16 bit encoding is also inadequate. A system which can produce 10 volt peak to peak signal will have approximately 150 uV best possible resolution from one least significant number step to the next. Practical systems have signal discontinuity of 4 to 8 times greater than this, as the state-of-the-art has not yet allowed near theoretical performance. A 20 to 50 uVolt discontinuity limit is typically considered just audible. Practical systems have distortions often ten times higher than this.

As noted earlier, the peak signal limit-expand and low level average expand-compress operations deal with resolution problems. Other distortions from time shift, alias, and quantization, which are inherent with even ideal encode decode operating to industry standards, still remain.

Distortion reduction may be accomplished in the following manner. Most digital distortions can be predicted, as they are strongly related to signal conditions which are easy to identify. It follows that, for a given signal, one can choose a best encode-decode process having the least audible or sonically damaging distortion. If one must operate to industry standards where the Nyquist limit is just outside the audio range, then a transient response versus alias compromise exists. This compromise occurs when requiring flat passband response and a very narrow pass to reject transition bandwidth. As the signal changes, one can choose the best process.

In practice, phase and time response are not equal from one complex filter-equalizer network to another and a slow fade or merge is needed to prevent inevitable switching transients with process shifting. Similar problems are dealt with for analog noise reduction processors. With digital processing, these operations of merging from one optimum filter or curve fit to another can be lookup table coefficients which are accessed as a sequence to merge from one filter type to another. While phase anomalies still occur, the decoded signal can, however, be free of beats or cancellations which plague analog fader type systems. The mix or filter change merge occurs just fast enough to prevent audible transients or other parametrically generated phase disturbance.

Since digital process timing is almost always crystal controlled, the record-play transitions can be made to track each other by pre-timed sequence programming which can be initiated by a single command. This eliminates the need for continuous numeric control and higher bandwidth for the control signal. All process types, transition speeds, and intermediate coefficients can be stored and run as a program from a single, one time command and the recorder-reproducer are effectively locked to each other.

The basic analog system uses resistor-capacitor time constants within threshold sensing logic to simulate predetermined transition speeds and the resultant tracking of intermediate filter mix states. In addition, other time constants also serve as internal memory to add hysteresis or hold back to decision making operations. These allow a first time quick process change decision and a reduced sensitivity to further changes thereafter until the time constant resets. This prevents unnecessary process changes during grey area or uncertain signal conditions. Like a digital system, the analog system has the ability to operate with simple switch on switch off control where the output tracks the input and where the output or reproduce subsystem does not have to detect signal conditions to do so.

Normal analog systems are not DC or direct coupled as is the case with digital, and these would require an additional data channel with a linear control signal or an internal analog signal conditions detector to make such a system operational. For practical operation, the basic analog system has been tested without buried or hidden code control and a third control channel with appropriate time delays has been included.

There are numerous ways to sneak through and hide the control signal within digital systems. As previously pointed out, one can random noise encode-decode a control signal in the least significant bit(s). This operation has no counterpart in the analog domain as it is nearly impossible to locate minuscule portion of a complex waveform carrying this information. In the digital realm, the least significant bit activity is always known. Hence, this bit can actually be borrowed for control purposes. Other ways to hide a control signal include using forbidden numbers or unused data words or number strings within a digital system which the same or a different system considers an error or nonexistent data. When the forbidden numbers are carefully chosen during encoding, the reproducer will recognize the error, but still decode its data signal correctly. of course, the forbidden number is data which can be extracted and used for the control function. Either method of concealment has enough bandwidth within Compact Disc standards to allow ample bandwidth or information carrying capacity to pass complex control signals. Any signal degradation from performing this operation is very small when compared to the improvements resulting from the added process power and re-construction capability being controlled.

Present industry standards are largely based on providing good performance in terms of flat response, low harmonic distortion, and high signal to noise ratio. Time, transient, alias, and resolution are compromised, but their problems or deficiency occur predictably with signal conditions. Consequently, a control logic must analyze the incoming program material and determine a best process.

The relatively simple basic analog system circuit makes quite accurate decisions of quantization versus alias distortion based on high frequency intensity and its ratio to average program level. This follows from the flat frequency response-sharp cut off compromise of the low pass filter design. In practice, the filter must be 85 to 90 dB down at the end of its 2 kHz transition region. Just prior to this, it must be flat to 20 kHz. Unfortunate and serious transient ringing must occur, as can be demonstrated from the analysis of a square wave with its upper harmonics sharply removed. The filter having good transient response will not remove enough alias causing upper frequencies.

Live program spectral energy, in the transition region and above, is unpredictable and ranges from bursts caused by microphone element peaks, instrument overtones, amplifier distortions, etc. Hence, a simple high frequency level detector can determine whether added filtering for alias reduction is needed or not. Since these distortions can be covered up by program sonics, an added weighting factor of reduced rejection during high program levels can be used. Therefore, the detector looks for ratios of high frequency Nyquist energy to average program levels to determine when more aggressive filtering is needed.

Essentially, a reduced second derivative around the cut-off slope yields improved time and transient performance. It is assumed that symmetrical filters having constant group delay are used, as they are practical analog and digital process types. These have symmetrical pulse behavior and can be made to mix/merge from one curve fit shape to another without altering group delay and creating excess phase interference during transit time. Practical systems can have as much as 200 uSec. time shifts near cut-off when full 90 dB alias rejection occurs. These numbers relate to about 0.15 inch rapid displacement or doppler shift of high frequencies which can occur very rapidly with music type waveforms. Certain types of transient intermodulation distortion (TIM) can occur under similar conditions. When corrected to 3 uSec/kHz change of upper passband conditions, a filter may have less than 50 dB rejection. However, as can be seen, a best choice compromise switchable system is practical.

A second group of compromises relates to quantization distortions and the smallest signals which can be processed. As noted, level change operations reduce these problems in a compatible manner. Some further improvements can be made by anticipatory forced resolution enhancement. Like the alias/transient operations, these are also curve fitting in nature and can be accomplished by record-play circuit systems resembling equalizing filters. In this case, a forced high frequency extension during record is made when signals have small amounts of high frequency information. When normal signal levels with high frequency content are present, the frequency response of the system is flat, but when the signal level is low and there is little energy in the high part of the spectrum, the frequency response in the record half of the system is boosted. The play circuit does the inverse operation. The overall least significant bit activity is substantially increased and more information becomes encoded via duty cycle modulation and increased dithering. When the record equalization (EQ) contour rises very sharply, most of this added information is just at and slightly beyond audio range. It has little effect on standard players or on hearing, because hearing acuity is low for these small, low level signals. Essentially, one has traded non-harmonic distortion for a similar amount of harmonically related program distortion. To a degree, the less accurate the player, the better this process works to disguise grainy noise as upper music harmonics.

Of course, a decoder can be instructed to perform flat response reconstruction and there would then be more data bits making the complete signal. Hence, quantization noise is reduced. This is another curve fitting operation which might be called dynamic dither, as it must be removed in the presence of strong signals. If left continuously on, alias or beat frequencies will occur from strong signal harmonics interacting with such excess energy high frequency dither. Clearly, the process must shut-off under intense high frequency conditions where resolution benefits become minor.

Control signals for resolution enhancement and distortion reduction processes can be derived by looking for critical energy in the alias frequency range. High ratios of these high frequencies to average signal conditions are indicative of possible foldover distortions made audible as they are not masked by program material.

Most significant are complex high frequencies by themselves such as those encountered with cymbals since low frequency problems are completely unmasked and are audible 60 to 80 dB below where hearing acuity is strong. Such signals and how fast they change can be sensed to determine a best process. Quick high frequency bursts above average level conditions suggest least filtering and best transient response, provided some midband energy in the predicted alias range is present. Low levels of high frequency energy suggest quantization or dynamic dither correction.

Since some process/filter/equalizer coefficient change operations can be more audible than others, some maximum number of changes become part of the decision making process. Dynamic dithering and resolution enhancement (EQ) are simple high frequency operations which can be turned off and on rapidly without sonic consequences from sudden phase shifts, beats, etc. Transient alias switching is much slower as time-phase changes do occur. Because of these possible process to process time change constraints, it is necessary to look ahead to observe the before and after signal conditions surrounding the decision point. In addition, the occurrence frequency of these changes, past and present, is important to prevent process hunting or decision instability resulting in unnecessary process changes.

Circuits to perform decision making are deceptively simple compared to what one might expect from the aforedescribed functional descriptions and the same holds true when the circuit equivalents operate from digital systems programming. The basic analog system uses analog circuit subsystems to perform these operations. These include, delays, voltage comparators, spectral analyzers, multipliers and signal detectors with time constant memory. High frequencies are detected and routed to three voltage comparators. One is set to detect minimum HF thereby switching on dynamic dither. The second is set to maximum allowable HF to switch on the large anti-alias filter. The third has a variable threshold dependent on program level. Each comparator has its own time constant or hold-off, so that, once fired, or its on-off state is changed, then a certain time must lapse before the circuit will respond again. In practice, these time constants are performed by diodes charging resistor capacitor networks and, as configured, the charge to discharge time can be easily made unsymmetrical. This behavior allows quick decisions of a "one shot" nature without having the circuit jump from state to state from near threshold conditions. Lamp/LED sources illuminate signal steering photocells to give quick fades from one process to another. As with the comparators, the lamp drivers for each process type have different on-off time constants to accommodate time-phase differences from one process to another. In addition, several time delays are used to allow logic action to happen prior to the signal conditions requiring the change.

Unlike analog noise processors which require record-play tracking and very carefully worked out signal thresholds, the basic analog system process decisions can be very rough. Accuracy is unnecessary as the reproducer process is always tracking. Since the operations are industry standard compatible, no major disaster will occur from a wrong decision. Hence, the analog circuits in the basic analog system have worked "as is" without refinement.

It is clear that when a digital signal and process is used, the encoding must have greater accuracy and resolution than the final industry standard product. one method to assure this is to encode with added bits at a high sampling rate and then perform successive decimation and arithmetic roundoff or truncation to make the final format. (44.1 kHz, 16 bit) Processing becomes multiple stages of delays, filtering, equalizing, instantaneous gain changing and averaged gain changing. The signal is analyzed and the results are used to interrogate a process "rule book". Several processes and their reproduce conjugates are available to be chosen based on predicted error and best signal reproduction. Once determined and initiated, transition parameters are accessed and the process starts changing. During this decision making time, the music signal has been delayed to allow the process transition to complete prior to the signal being matched. A control word is generated and encoded for inclusion in the recording, so that the reproducer can access from its memory the complementary process and its synchronous transition parameters. Both operations commence relative to their timed sequences and to their stored data. Since the recorder has already simulated the pre-programmed reproducer action or the corrections for consequences of its action, both processes change synchronously within the time accuracy limits to the encoder-decoder crystals or clocks. The system then changes itself without having major transition aberrations and then operates with the best performance for the signal conditions.

Figure 9:
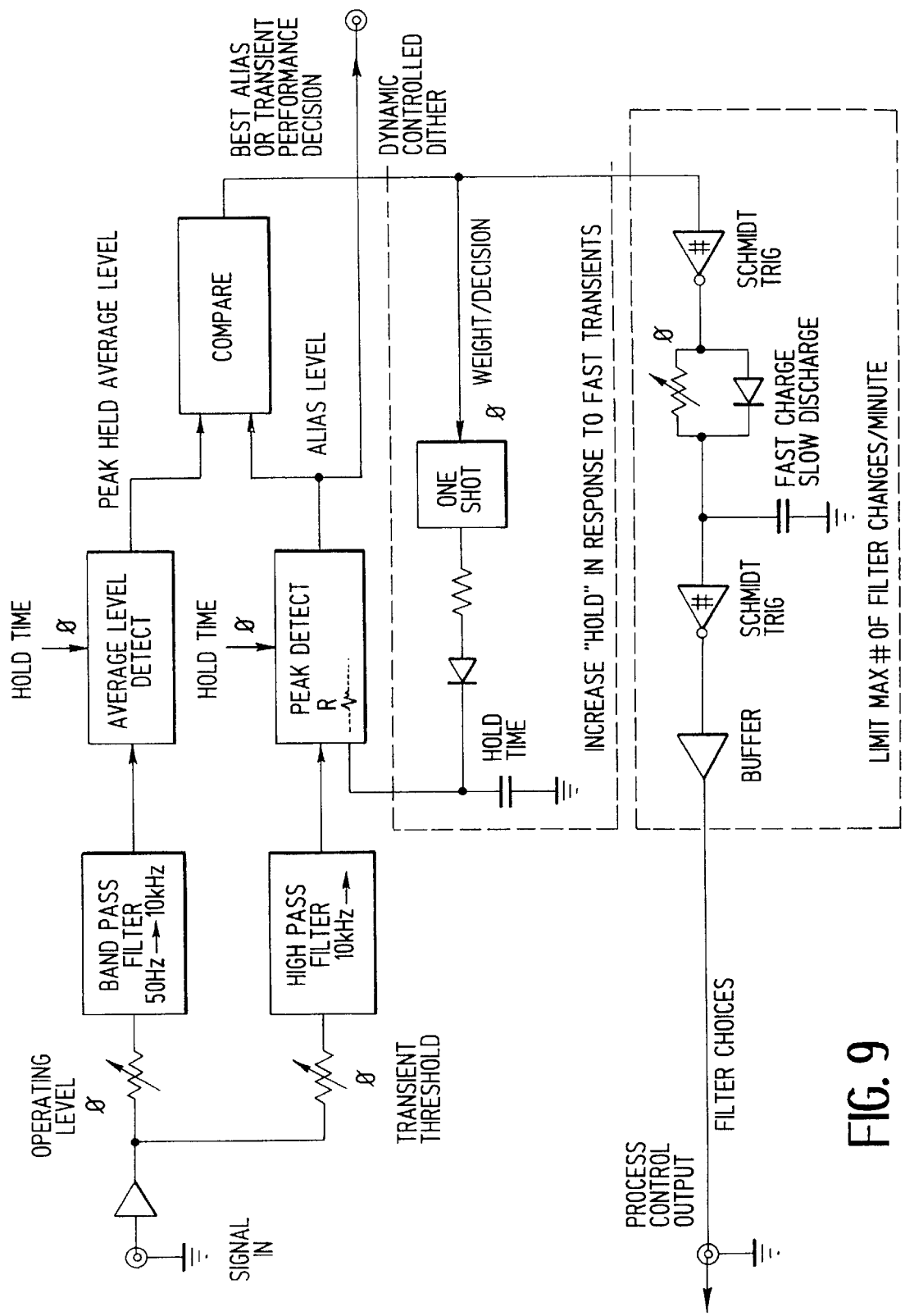
FIG. 9 is a block diagram illustrating filter selection control in one embodiment of the invention.
Figure 10:
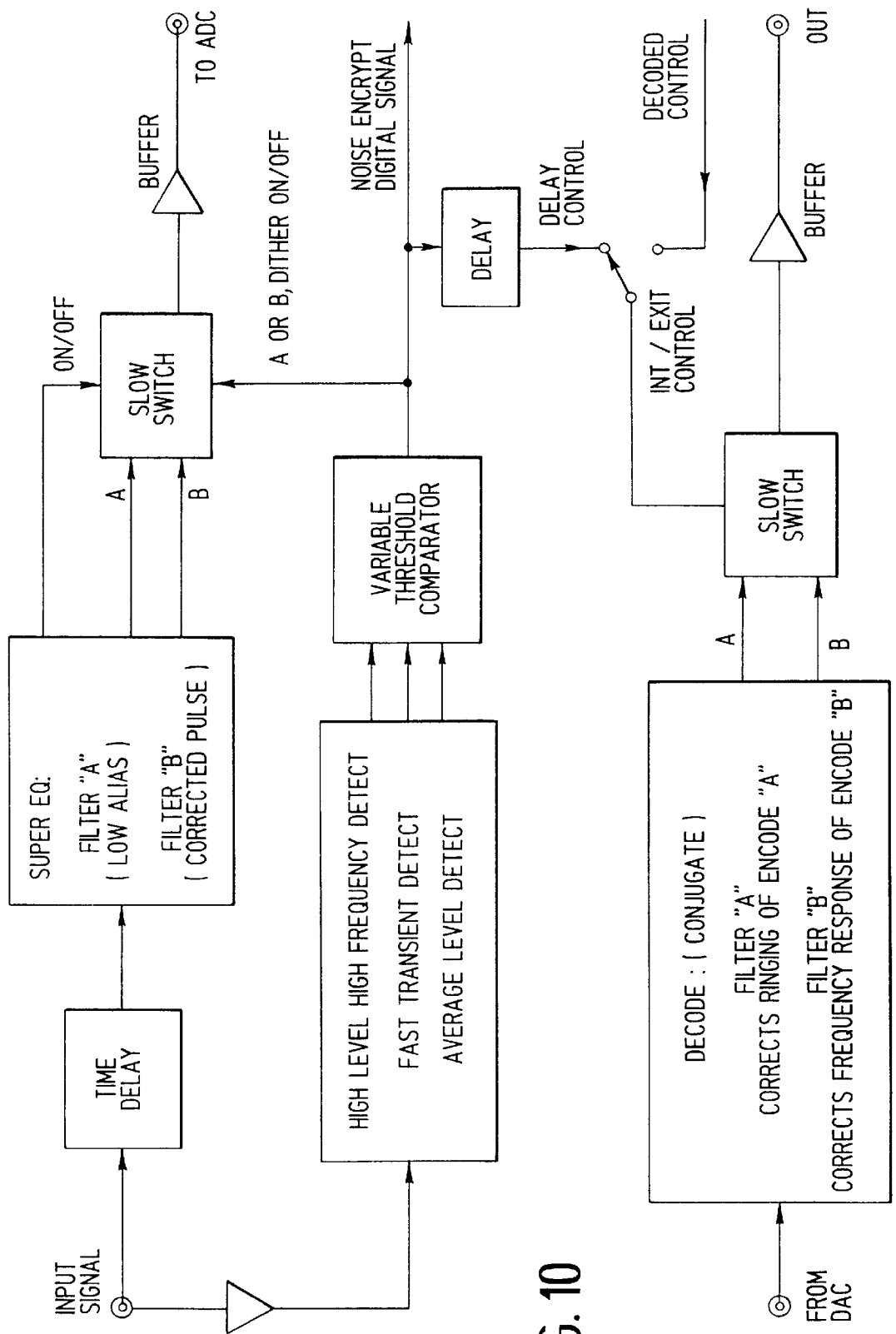
FIG. 10 is a block diagram of a process switcher utilized in one embodiment of the invention.

Referring now more particularly to FIGS. 9 and 10 of the drawings, there is shown a system which can choose an optimum recording process and its reproduce conjugate to achieve low alias or quickest changing, fastest settling transient response. Phase interferences during transition time are controlled by "fader" time constants and signal delays. The logic circuit has one comparator set up to change state when alias distortion would be greater than an approximate 40 dB below peak program level.

This circuit, shown in Appendix C included with this specification, contains four sets of back-to-back LED-Photoresistive cell switchers and driver circuits. Signals are delayed to allow process decision times and transition time constants are adjustable to allow smooth fading between two process signal paths. Controls are derived from an analysis filter and detector made sensitive to highest alias frequencies. A peak level detector sets a voltage threshold from which a comparator can be referenced. Alias components above this level setting will switch processes. A second program delay is used to synchronize record-play tracking and effectively matches variable time constants of the LED drivers. Different control settings allow this circuit to operate either alias/transient as a dynamic operation or quantization/distortion as an independent operation.

These circuits are set up to be compatible to industry Compact Disc standards. The encoded product having these variable-dynamic processes will play back with equal to or better sonics than without processing, even on a standard home player without the decoding features of the invention. Circuit subsystem blocks correspond to those used in previously discussed embodiments of the invention.

Figure 11:
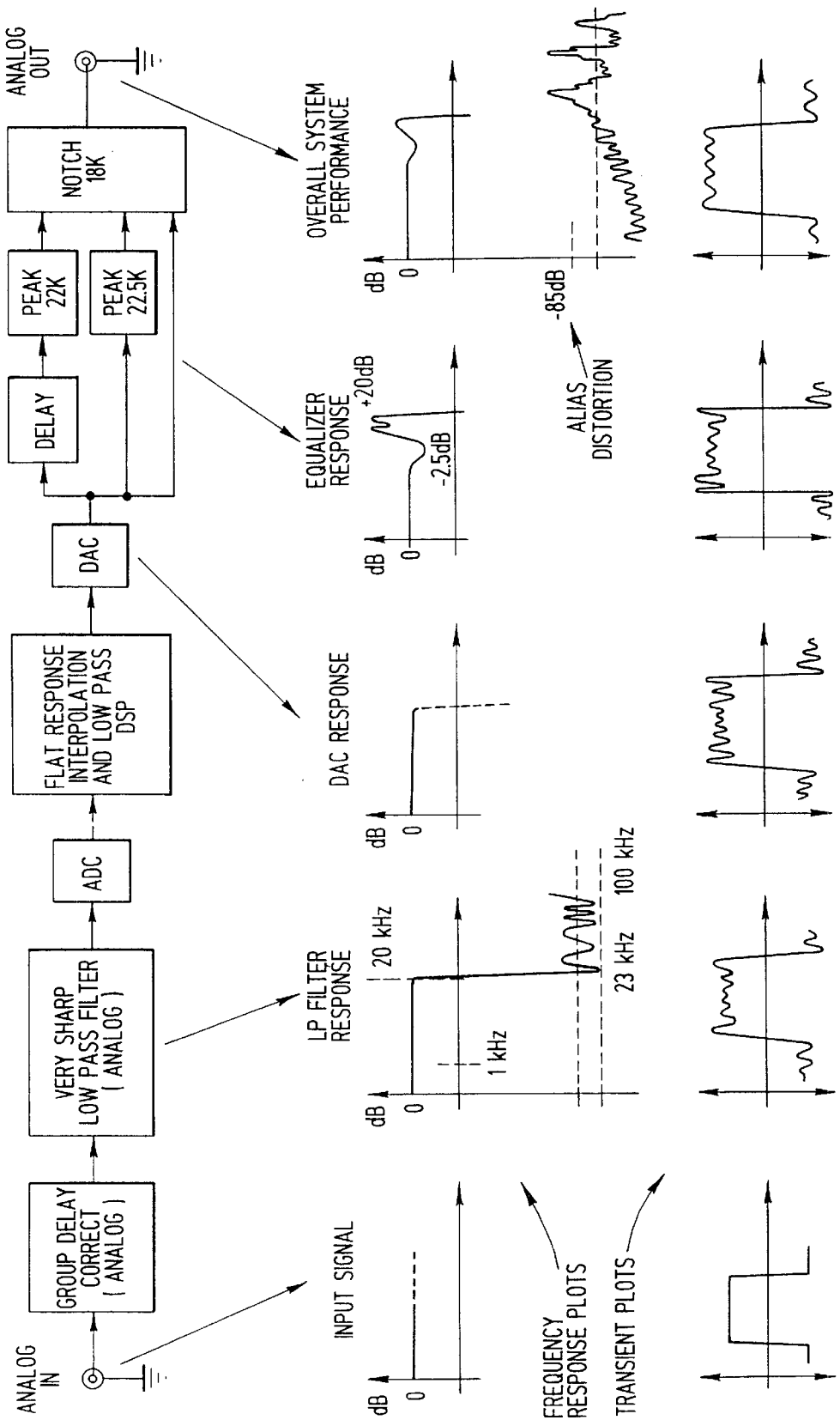
FIGS. 11 and 12 graphically depict waveforms and distortion plots illustrating system response before and after process for two filter types, in accordance with the invention.

As observed in FIG. 11, "process A", there are waveforms and distortion plots starting with input signal, output of uncompensated encoding, the conjugate restorative response, and the overall corrected system response. Test signals include slow sweep forward from 20 Hz to 30 kHz, 3 kHz square wave, and distortion measured from 20 Hz to 30 kHz frequency sweep at near operating level.

Figure 12:
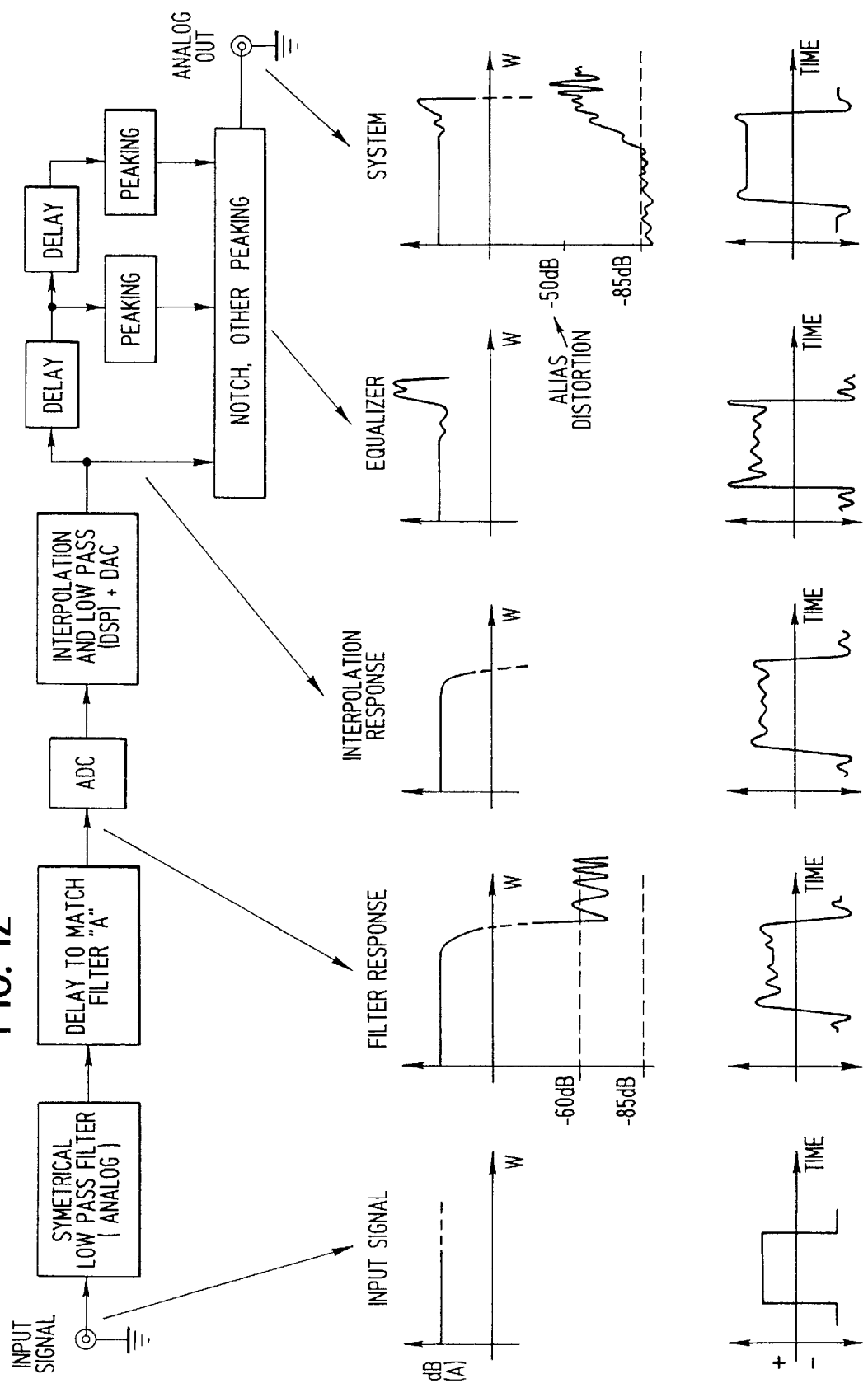

FIG. 12 illustrates "process B" and uses the same format as FIG. 12 for "process A", except the plots are for the fast transient process.

One method of overcoming the frequency response limitation imposed on digital recording systems by industry standards and its effect on transient response is the use of slew rate compression, as discussed earlier. Slew rate limiting and expansion operate in a similar manner to the peak amplitude methods previously described. As before, a nonlinear element is introduced in the signal path to perform the desired limiting, and the expansion or reconstruction method involves placing the same device or circuit in the feedback loop of an operational amplifier. Variable conduction of diodes with increased voltage is used for peak amplitude limiting whereas increased current through a capacitor with increased signal speed is used for slew rate limiting and expansion. Slew rate limiting takes an event and spreads it in time and, hence, its use must be limited to occasional events like those occurring in musical programs.

Figure 13:
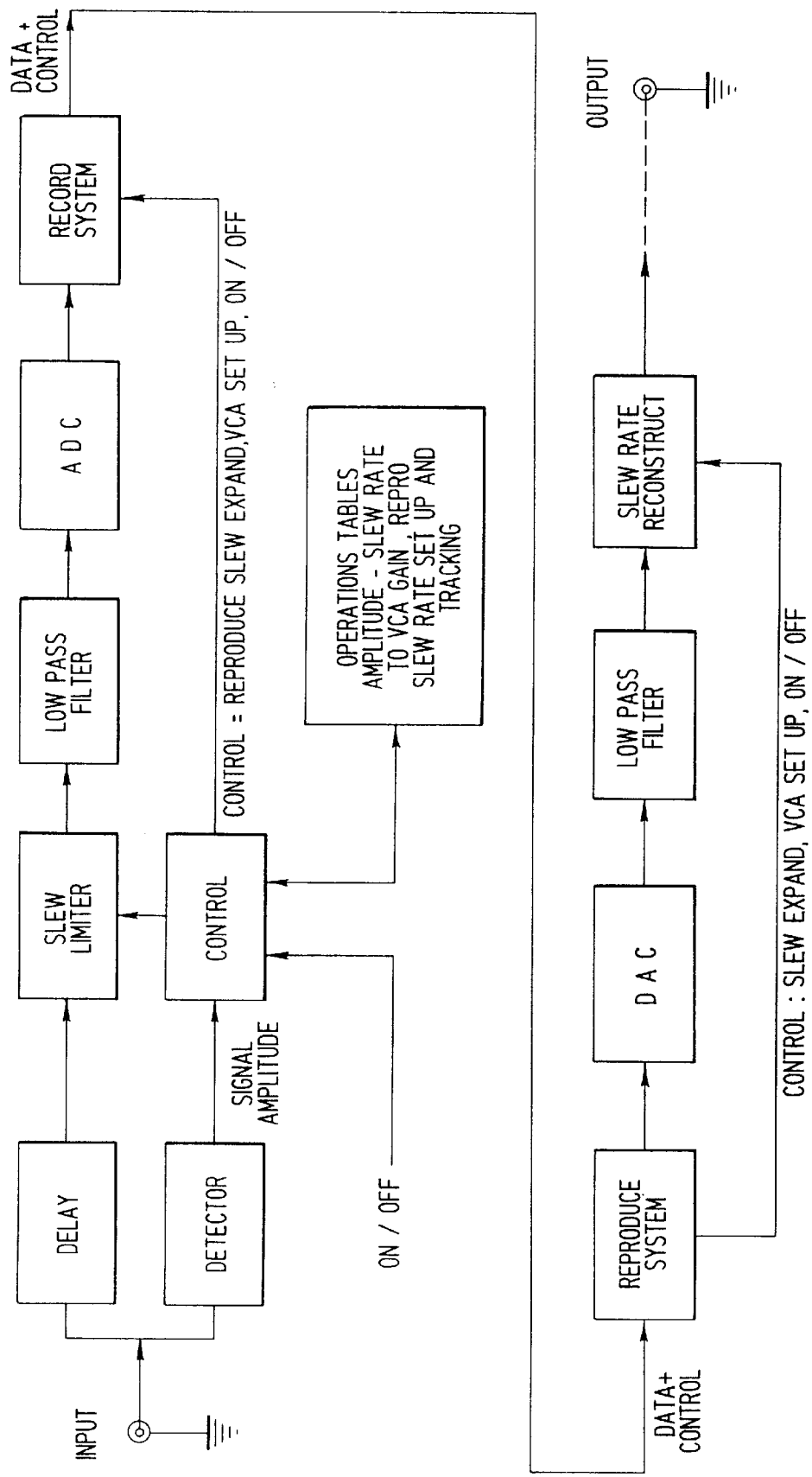
FIG. 13 is a block diagram of an analog implementation of a slew rate compression and expansion system.
Figure 14A:
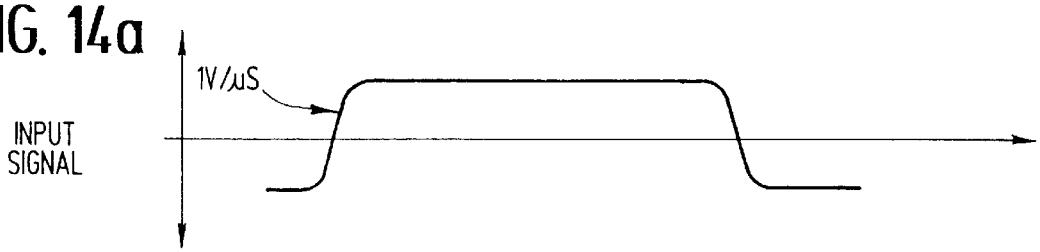
FIGS. 14a through 14e show waveforms illustrating the operation of a slew rate compression and expansion system.
Figure 14B:
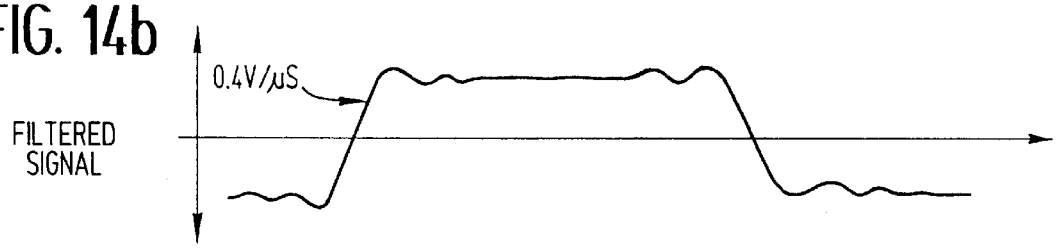
Figure 14C:
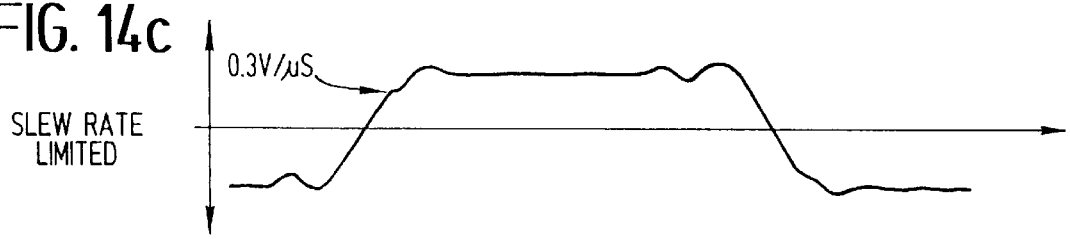
Figure 14D:
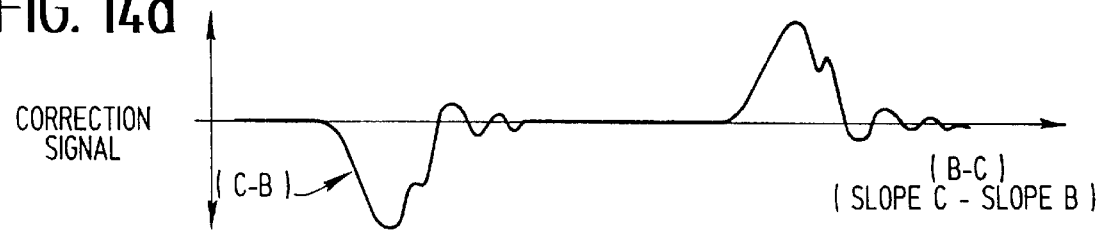
Figure 14E:
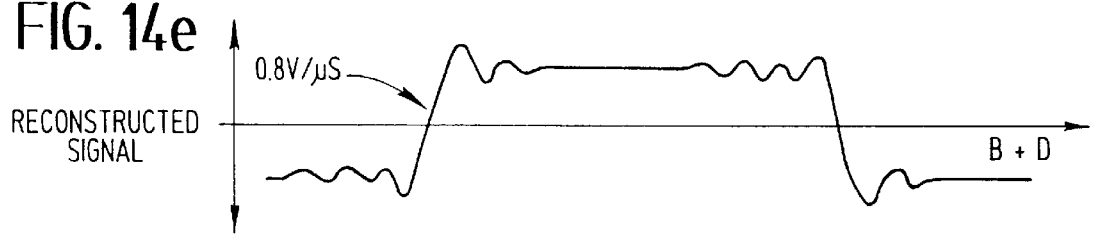

The basic system using an analog implementation of slew rate compression is shown in FIG. 13. Typical waveforms associated with its operation are illustrated in FIG. 14. Schematic diagrams of the key modules are included in Appendix D included with this specification and are discussed below.

Fig. D1 shows an example real time slew limiter having a circuit configuration somewhat analogous to the diode limiter types previously described. Here a representative wideband square wave signal with transitions of many volts per microsecond is shown applied to an amplifier, marked $A_1$, which is constructed to have a restricted slew rate performance of much less than one microvolt per microsecond. Its square wave output now has a well defined rise and fall character. When the input and output of this amplifier are compared and the gain structure is appropriately set to cancel slowly changing signals, the slew rate limited part of the signal becomes available. A bridge-like circuit of the amplifier $A_2$ and the resistors $R_1$ through $R_6$ perform this task and its output is the distorted portion of the signal occurring during slew limiting. When this correction signal is appropriately amplified and added to the slew limited signal, the original input square wave is restored.

A very high performance slew limiting amplifier is needed for this task and a specialized circuit configuration must be carefully worked out to prevent sub-harmonic, recovery, and overload distortions. In addition, the degree of slew rate limiting with respect to signal speed must be predictable so that acceptable reproduction can be reconstructed when the correction signal is not present, as might be the case in a simple reproducer. A standard operational amplifier will not work adequately for this task. Fig. D2 shows a simplified conceptual variable slew rate amplifier where all parts operate in linear class A so that conduction occurs under all signal and limiting conditions. Voltage controlled variable current sources marked I+ and I– are used to achieve slew limiting. Two of these circuit groups marked A and B oppose each other and the balance between them is modulated by the input signal through FET devices marked C and D. Current limits either side of balance are restricted by diodes E and F which are in turn controlled from a balanced phase inverter FET marked G. Slow changing signals create small currents through the capacitor marked H and have inconsequential effect. Large fast changing signals demand more current and the limiter restrictions then restrict slew rate in an ever increasing manner following the diode conduction versus voltage curves. Hence a low distortion predictable and controllable symmetrical slew limit occurs. A more detailed schematic is shown in Fig. D3.

In practice, it would be desirable to be able to reproduce an occasional fast signal such as percussive transients. These may have large fast transition waveshapes which are quicker than filter and sampling limitations allow and the above circuits arranged like the diode expander will perform this operation without requiring an external correction signal. Fig. D4 shows this arrangement. The variable slew amplifier is now made slower than the anticipated input signal from the reproducer so that the difference between the recorded signal limitations and the reproducer amplifier performance now becomes a synthesized correction signal. As before, $R_1$–$R_6$ and amplifiers $A_1$ and $A_2$ are like a bridge which cancels unlimited signals and presents the slew rate difference between input and output. Previously, the limited and corrected signals were added to restore the input. Now an overcorrection is made to anticipate the signal that would have been at the encoder input prior to band limit filtering. This operation then uses an overcorrection signal which will vary from one signal condition to another, hence a controlled variable gain device, VCA, replaces the fixed $R_7$ of the previous circuit. When the control signal has been properly set up for this event, an error correction signal can be added to the input signal to yield a much faster transient reproduction which now more closely resembles waveshapes of wider bandwidth input signals. As can be seen, a transition shift approximating slew restoration occurs and if time integrity is needed, the signal must be advanced back in time by a variable delay so that during this reconstruction, the edge transition occurs where it would have in the original program material.

Both slew rate and correction signal gains are controlled. These are analogous to curve segment shapes which might be stored in and recalled from lookup tables and size scalings which can be determined from examination of the signal. Capacitors and diodes from analog circuits create predictable slew dependent curve shapes and voltage controlled amplifiers respond to size information. Rate of change of numbers compared to some averaged number scale and multiplier coefficients in memory simulating curvature or a non-linear function can do the same operations in the digital domain. Either operation depends on having first tested the record and predicted reproduce synthesis during encoding and then generating a control signal which sets up the reproducer to track the best tested results. To do this with the analog circuit, the input signal is lowpass filtered, possibly slew limited, and then compared with a yet lower slew rate limit circuit to get a correction signal. VCA gain is then adjusted to get a best match between band restricted and unrestricted signals. Slew limit, VCA settings, and engage time become the control information. Since the reproducer has the same circuits as those used for encoding, the output waveform will track. Clearly many other analog and digital methods to determine and synthesize slew limit and expand can be used. However, a unique aspect is that these operations can synthesize many high definition points of a waveshape portion from pre-coded curve shapes which are accessed from a low information content control signal or can perform a first order approximation of the waveshape in the absence of control.

A presently preferred embodiment, in accordance with the invention, will operate primarily in the digital domain and has the same very basic overall system design, as shown in FIGS. 3 and 4 of the drawings. As in the case of the analog system (e.g. FIG. 8), each subsystem is a subtantially self-contained circuit or functional module which performs a unique operation. Input and output signals of these modules are quite often similar from one design or product to another. Hence, if the component or subsystem added to improve performance does not significantly change these intermediate signals or the circuit configuration, then compatibility to standard equipment and recordings is much more likely. In our case the "DSP" or digital signal processing subsystems in 100–102 and 104/105 are the unique elements while the remaining components of the system have few changes and are left as they normally appear in products.

Figure 15:
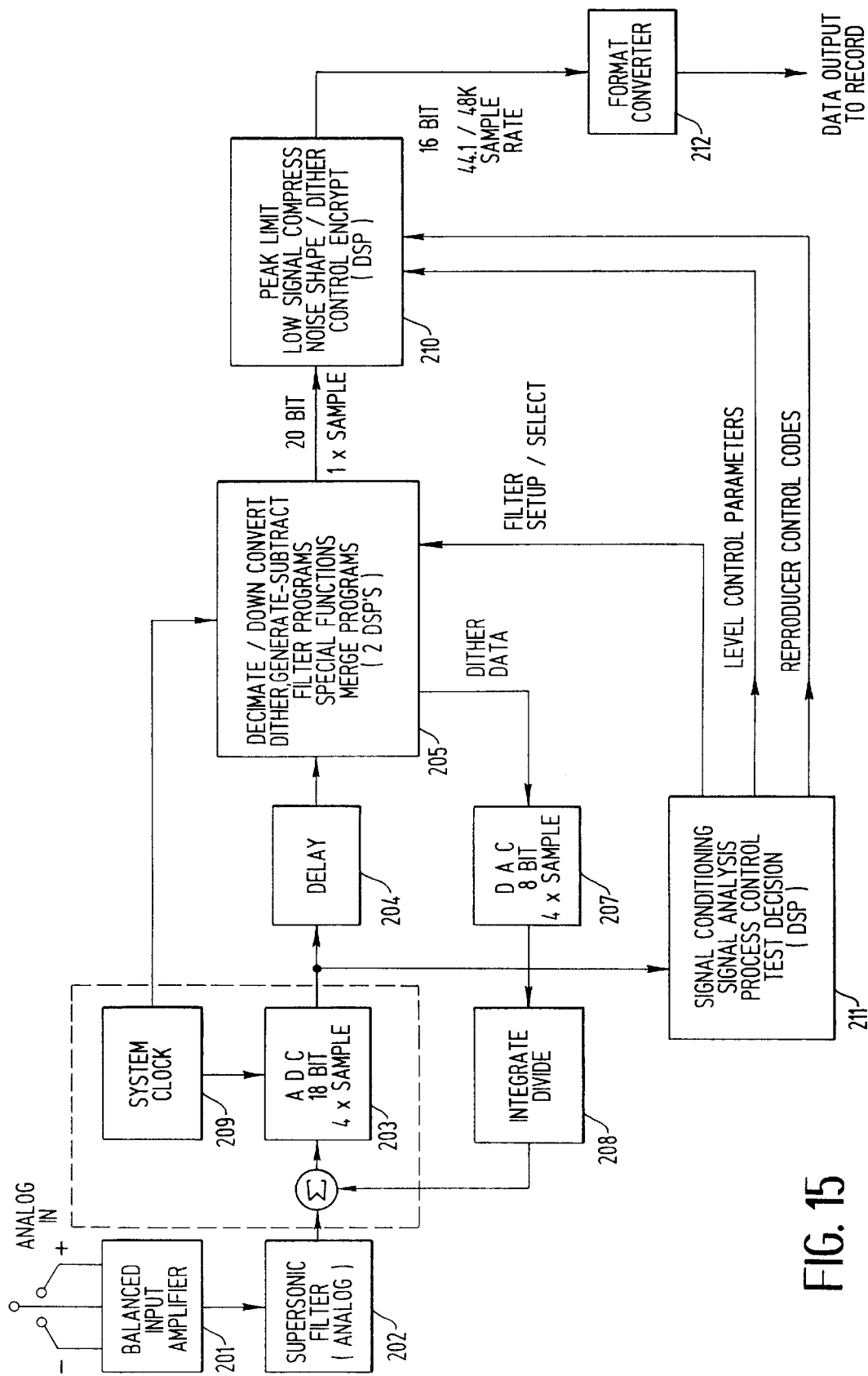
FIG. 15 is a block diagram of a more advanced, presently preferred digital embodiment of the encode system, in accordance with the invention.

As best observed in FIG. 15, a more detailed diagram of the presently preferred digital embodiment of the encode system, highly specialized operations are performed by functional groups of electronic components. Quite often, each performs a unique task which can be examined, evaluated, and described independently without involving other portions of the digital system. Hence, each element is a functional building block much like a sound system component which can be specified and compared to others.

The analog input signal is applied to a balanced input amplifier 201 followed by a supersonic low-pass analog filter subsystem 202, which first isolates both signal and processor grounds and then removes frequencies above the Nyquist limit. In this manner, crosstalk between digital and analog signals is reduced. Audio signals must be isolated from digital circuits in order to prevent interaction and crosstalk noises. If not done effectively, these problems propagate throughout the audio component chain as well as within the encoder electronics. The supersonic filter is needed to eliminate high frequency components in the incoming signal, including radio frequency leakage and other noises, which would otherwise create alias and foldover distortions or beats when the signal is sampled. The output of the filter is applied to an oversampling A to D converter. In the embodiment shown in FIG. 15, the signal is sampled at 4 times the final 44.1 kiloHertz frequency. In another embodiment, we used a converter running at 8 times 44.1 kHz. As part of the transient analysis described below, we are interested in frequencies up to at least 40 kilohertz, and therefore, the filter response begins to role off above this region. In both cases, the cutoff frequency of the filter is well above the normal audio range, so that the filter can have a gradual roll off and not introduce audible phase distortions. The "brick wall" alias filter for the encoded signal is implemented as a digital filter in the decimation process described below. It is essential, however, that the response of the analog filter be down below the resolution limits for frequencies which would alias into the audible range (i.e. input above 132 kHz for 4-times oversampling), since these alias products cannot be distinguished from the program material or filtered out later.

State of the art filter designs attempt to keep alias and foldover noises well below the resolution limits of the digital code. The well known Compact Disc encoding yields 16 bits of data sampled at 44.1 kHz. Input frequencies above 22.05 kHz exceed the half sampling rate Nyquist limit and simply will not play back. Instead, one gets lower frequency difference components which, to be inaudible, should be at least 85 dB down for a standard CD. However, the invention needs a digital signal with higher resolution, which means proportionately more stringent filter characteristics. Since we are dealing with a signal with approximately 20 bit resolution, as described below, we need to keep input signals which would cause alias products down by at least 108 dB. Because of their similar non-musical character, crosstalk interference between analog and digital processes must be at least as low.

While analog filtering and isolating operations are functionally separate operations, the required circuits are related and often work best when constructed together from one group of components. Good designs may have fully balanced push-pull signal paths, as well as separate power, grounding, and shielding.

The output of the supersonic analog filter 202 is applied to the sample and hold and analog to digital conversion subsystem 203 through a summing junction in which dither is added. The continuous analog signals are sampled at regular intervals and the sample voltage held unchanging long enough to be converted to a binary number or word which represents the amplitude of the sample. As has been discussed previously, faster sampling rates give more points to define the signal waveshape and longer digital codes or more bits give finer resolution for each sample. Accurate conversion is very difficult and many clever techniques to achieve it are represented in commercial products. We are currently using a commercial hybrid integrated sample and hold and A to D converter which can operate at a 176.4 kiloHertz or 4 times oversample rate and produce 18 bit digital words representing the sample amplitudes. This unit is at the limits of the current state of the art in commercially available converters. Prior to the availability of these converters, we used another commercial converter with 16 bit accuracy at an 8 times oversampling rate.

In order to get resolution in an A to D system which matches the capability of modern converters, great care must be exercised to minimize noise and analog-digital interaction. One of the techniques which we use is called silent conversion. In order to prevent digital interferences to analog signals and conversion timing, the entire logic and conversion system shuts down prior to the critical sampling operation. Noise from cables, IC's and other parts becomes ten to one hundred times less and a signal sample to accurate to millionth's of a volt occurs. Once the analog signal is sampled and safely held, the conversion process resumes and the digital code is sent to the digital signal processors. Other systems do not work like this and are severely hindered by noise, crosstalk, or glitches.

Another aspect of A to D and D to A conversion which is very important, as discussed earlier, is the minimization of sampling time jitter. Findings recently reported in the audio trade press indicate that a jitter of 100 picoseconds in the sampling time is clearly audible. In order to keep this jitter to a minimum, we place the system clock 209 in the A to D converter module. We use a clock circuit designed to have very low phase noise, and use a short path to the converter. The clock is also buffered and used to provide the master timing to the rest of the system.

Oversampling, in addition to the advantages regarding analog filter design previously discussed, allows a given converter to achieve a higher amplitude resolution, or more bits to represent signal levels, when decimated. Each additional bit doubles the encoded resolution to yield an almost 6 dB greater dynamic range. In 4 times oversampling, for example, 4 samples are taken for each one present in the final format, and those extra samples contain more information about the original signal. Some decimating converters simply discard this additional information, but we convert it into amplitude resolution by using subtractive dither. One of the functions of the first DSP subsystem 205 is to generate a dither signal, which can take one of several forms, including a sawtooth, a sine wave, and a pseudo-random noise. A process within the DSP generates small seemingly random numbers, which are scaled to fractional bit levels. These numbers are applied to a digital to analog converter 207 whose output is smoothed and scaled or attenuated in 208 to achieve fractional bit levels when added to the incoming analog signal. The voltage is added to the audio signal thereby creating a vernier effect. Within the DSP system 205, the dither numbers are delayed to match the system delay for samples coming from the A to D converter 203 and the dither is subtracted out again. When the signal is averaged by the low pass filter process in 205 as part of decimation, the smallest signal components can be determined to fractions of a least significant bit of the converter. These operations must occur at the incoming sampling frequency and, in the present scheme of 4 times oversampling, up to an extra two bits of resolution is possible.

The digital output of the analog to digital converter is directed to the signal analysis subsystem 211 and through delay subsystem 204 to the first digital signal processing subsystem 205. The delay provided by 204 allows analysis of the signal to be made and a process control decision taken before the signal reaches the DSP system. In this way, the DSP is never "surprised" or caught off guard by changing signal conditions.

In a presently preferred embodiment, the digital signal processing subsystem 205 is implemented using two commercial DSP processors with 24 bit word length and 56 bit accumulators. It performs a variety of functions, including: generation, delay and subtraction of the dither signal, described above; low pass filtering the signal using a variety of filters; decimation of the signal to the industry standard sampling rate; and handling the transitions from one filter to another under the command of the process control subsystem 211. First, a delayed copy of the dither which was added to the analog signal prior to conversion is subtracted from the incoming digital signal. The signal then undergoes decimation, which involves low pass filtering followed by repeatedly discarding three samples and keeping the fourth. It is this digitally implemented low pass filter which performs the anti-alias function for the signal at its final sampling frequency, and, as discussed previously, no single filter implementation can be ideal under all program conditions because of the steep transition between the passband and stopband required. While a symmetrical finite impulse response digital filter is free of the variable group delay and phase distortion effects which plague analog filters, there are still tradeoffs between alias rejection, transient response, and passband frequency response. The invention solves this problem by using different filter characteristics for different signal conditions, and making a smooth transition or merge from one filter to another. The implementation of the filters is a standard one for FIR filters using multiply and accumulate functions. The result of decimation is a signal having approximately 20 bit resolution at one-times sampling rate. This 20 bit accuracy necessitates a filter stopband rejection of at least 108 dB to keep alias products below the resolution of the signal.

The output of DSP subsystem 205 is a digital signal at the industry standard sampling rate (44.1 kHz for CD's) having 20 bits of information. This signal is passed to the second digital signal processing subsystem 210, which packs the 20 bit resolution into 16 bit words matching the industry standard and adds control information for use by the reproducer. These operations are carried out under the command of the process control subsystem 211. The information packing is accomplished using a digital implementation of the analog system described earlier. For level peaks in the program, an instantaneous soft limit transfer function is used. Since it is implemented in an exact mathematical way, the transfer function can be chosen to have minimum audible effect for undecoded playback and can be exactly reconstructed in the reproduce decoder. It is also possible for the process control subsystem 211 to alter the limit parameters, such as changing the limit threshold in response to the degree of limiting which may already have been applied to the signal before it reached the encoder. In doing so, the controller can also send the parameter information to the reproducer using the control codes hidden in the signal.

For very low level signals, an average gain compression is used to increase the system gain. This gain increase raises the level of those small signals further into the upper 16 bits of the digital word, and then the 20 bit word is rounded off to 16 bits, matching the industry standard format. The gain is controlled by subsystem 211, which looks ahead in time from the point of view of the DSP system 210. 211 sees an undelayed signal, while the DSP system gets one delayed by 204 and 205. The control subsystem also inserts control codes which tell the reproducer what it has done with the gain. The second DSP subsystem is also used to apply "dynamic dither" or noise shaping as discussed above in the analog description.

The final task of the DSP system 210 is to encrypt and insert the control codes into the least significant bit of the digital words. The details of this process are discussed later. These are the codes which tell the decoder what has been done to the signal, so that it can carry out complementary processes.

Both DSP subsystems receive commands from the signal analysis and process control subsystem 211. This module receives the oversampled digital signal directly from the A to D converter, conditions it, analyzes it, and based on the analysis, makes process control decisions and sends commands to the DSP modules. It also generates the control codes for the reproducer which are included in the encoder output. The module uses digital versions of the analog algorithms discussed earlier:

It uses ratios of high frequency content to total amplitude along with detected isolated transients to select filter programs for the decimation filter.

It measures the average signal level of the broad middle frequency spectrum and uses the results to control the gain of the low level compressor. It also generates reproducer control codes to correctly complement the encode gain structure.

It measures the average level of low level high frequency signals, and invokes dynamic dither insertion of extra high frequencies when appropriate.

It analyzes the distribution of peak amplitudes to determine if the incoming signal has been limited prior to the encoder. If so, it can raise the threshold of the encoder's soft limit function, or turn it off altogether.

It can compare the decimated signal to the over-sampled one delayed to match the decimation to look for isolated bursts of high frequency information which represent transients which would not fit within the normal 22 kilohertz bandwidth. These difference signals can be sent to the reproducer in the control channel, spread in time, so that the reproducer can correct the transient on playback.

It can also use the transient analysis to control slew rate limiting of the main signal as an alternate approach to increasing the apparent bandwidth of the system, as previously discussed.

It controls the insertion of hidden codes in the least significant bit of the encoded signal, putting them in when needed and letting the LSB be used for the main signal when it is not needed for control.

The process control subsystem is the nerve center of the encoder, making the decisions and controlling the functions of the DSP units. It is not necessary for a given implementation to incorporate all of the features above. For economic reasons, it may be desirable to only include a particluar subset. Since the encoder uses control codes to tell the reproducer what it is doing, a more capable reproducer will not be confused, and a less capable one will ignore those functions that it cannot complement.

The digital data output from the second DSP module 210 goes to the format converter and then to the recorder. Compact Disc, digital audio tape, etc. operate on similar encoding principles. However, these systems have different recorded formats and electronic signals for the same 16 bits of encoded program data. In the industry standard format conversion subsystem 212, specialized IC chips are configured to add program track information and other housekeeping information to the data and combine the two channels of 16 bit program digital data into a single data stream which has been configured to industry standard formats. The end result is a combined data and operational code made compatible with the input of a standard digital recorder. This module performs functions common to all digital recording systems, and uses commercially available special function integrated circuits to perform the format conversions.

Figure 16:
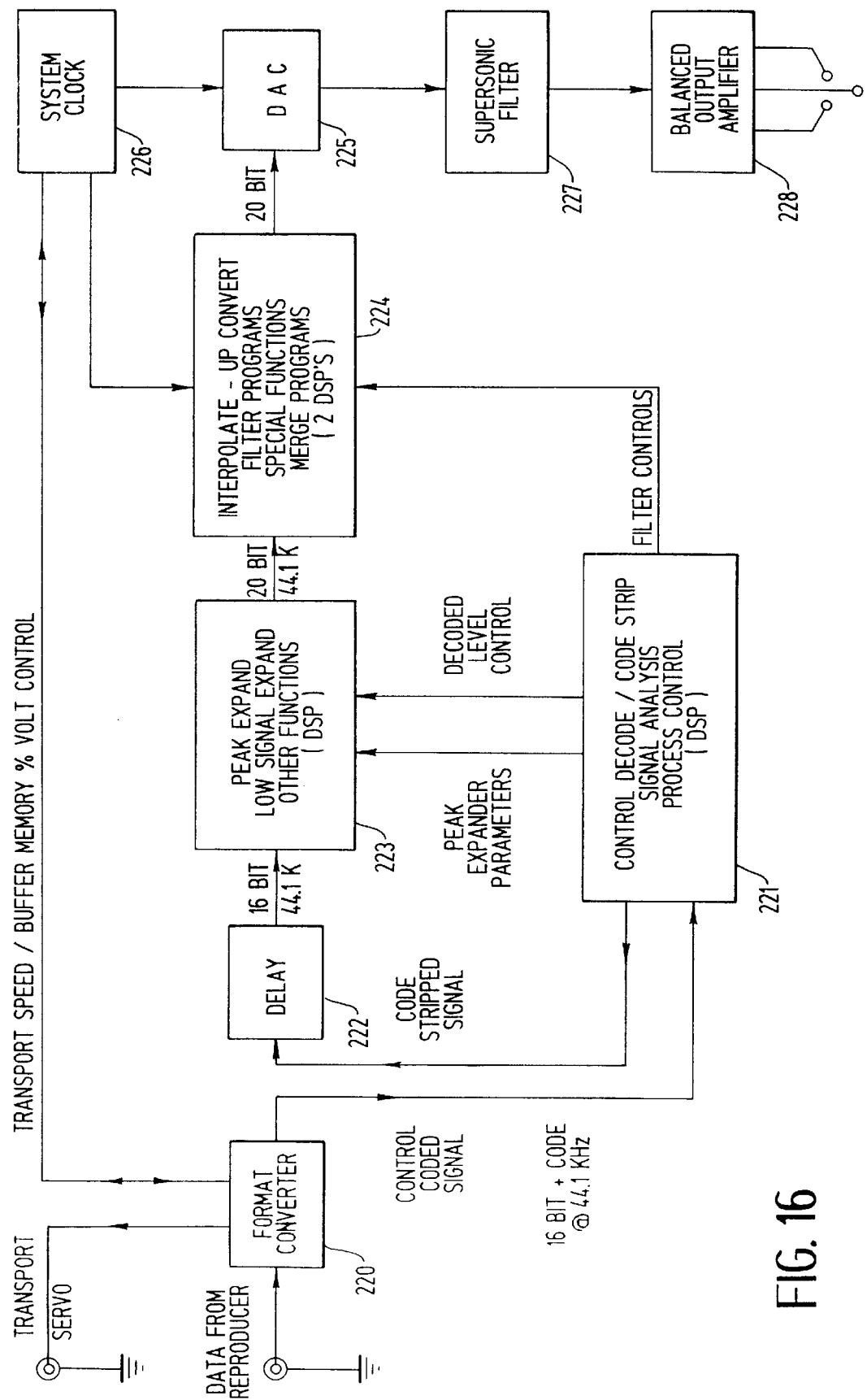
FIG. 16 is a block diagram of a more advanced, presently preferred digital embodiment of the decode system, in accordance with the invention.

As best observed in FIG. 16, a more detailed diagram of the presently preferred digital embodiment of the decode system, highly specialized operations are performed by functional groups of electronic components. In the playback subsystem, the first element of the reproduce chain could be a video player, CD player, receiver or other equipment.

These components usually have servos, conversions from specialized standards, buffer memories, and occasionally phase or frequency locked timing systems to achieve stable continuous playback signals. For example, such a system could be a CD transport. Each type of digital system requires its unique unscrambling, patching, and fixing operations to eventually extract "error free" program digital data and this is accomplished by standard circuitry within the player or other device. The output of the player is a stream of digital data in one of several industry standard formats, and this stream of data forms the input to our decode system.

Referring to FIG. 16, the data from the reproducer is applied to a format converter 220, in which one of the industry standard serial digital data formats is converted into a form suitable for use internally within the decoder. The data is normally split into right and left channels at this point for separate processing. This format conversion is carried out using commercially available integrated circuits designed for this function. This subsystem also may provide servo feedback control to the transport to control the incoming data rate, and it provides timing information to the decoder system clock.

The data output of the format converter goes to the control decode module 221. This subsystem is complementary to the process control subsystem 211 in the encoder. Its functions include detecting and decoding the hidden control codes inserted by the encoder, possible code stripping or removal of the code from the signal, signal analysis of the data signal, and generation of process control signals to control the DSP modules based on the nature of the signal and the hidden codes.

The data signal then goes to delay module 222, which gives the control decode module 221 time to figure out what to do with the signal before it gets to the first DSP subsystem 223. The first DSP module 223 is the complement to module 210 in the encoder. It does a peak expansion which restores the peaks limited in 210. It does a low level gain expansion, restoring the low level dynamics compressed in 210. It can complement the low level forcing of high frequencies in the dynamic dither operation, restoring a flat frequency response and lowering quantization noise. It performs some housekeeping functions, and its signal output has 18 to 20 bits of real information at the one-times sampling rate (44.1 kHz for CD).

This more accurate digital signal at the media sampling rate is routed to the second digital signal processor subsystem 224, which is complementary to encode module 205. In this subsystem, the signal is interpolated to a higher sampling rate using a variety of smoothing filters which are chosen to complement the decimation filters in 205.

All D to A conversion systems involve a smoothing operation to convert the discreet sampled signal back to a continuous analog waveform. Digital interpolation is frequently used to increase the sampling rate by calculating a larger number of steps representing the continuous waveform. A larger number of smaller amplitude steps reduces the burden placed on the analog smoothing filter 227 following the conversion back to analog form. Most player circuits employ some version of this technique. Again an "oversampling" has occurred. However, in a normal player, the information content between input and output from interpolation has not changed since the filter cannot create new information from its curve fitting computations. By contrast, our interpolation subsystem has knowledge of the signal resulting from an analysis made in the encoder prior to the bandwidth limiting decimation. This information has been sent to it through the control channel in the form of filter selection control, and transient correction or enhancement data, and thus this interpolator can restore some of the information deleted by the decimator.

The decode system can also provide some improvement to playback of standard unencoded signals by analyzing the incoming signal characteristics in module 221 and using the results to pick a smoothing filter which is probably best. This single ended operation results in an improvement over a conventional player, but it cannot achieve the performance of the full system.

The smoothing or interpolation filters in DSP subsystem 224 are standard finite impulse response or FIR types, which are made symmetrical to avoid phase distortions. The subsystem must implement smooth transitions or merge operations from one interpolation filter to another in the same manner as the decimator does. It may also include transient synthesis and slew rate modification, similar to the analog implementation discussed earlier.

In summary, the first decoder DSP module 223 restores amplitude resolution, and the second DSP module 224 restores frequency or transient resolution. Both of these operations are the complements of operations in the encoder.

The high resolution oversampled signal goes to the digital to analog converter subsystem 225. As in the encoder, we use a commercially available D to A converter module which represents the current state of the art. The current embodiment uses 20 bit converters operating at 4 times oversampling. We have also used 18 bit converters at 8 times oversampling. As in the encoder, great care must be taken to isolate the analog signal from the digital noise, and sample timing jitter is minimized by using a low noise master clock tightly coupled to the converter module. The analog output goes to the supersonic filter.

In the analog smoothing filter subsystem 227 and output buffer amplifier subsystem 228, final rounding and removal of supersonic signals occurs with an analog low pass filter along with amplification to standard line levels and output impedance. A sophisticated design such as ours treats the analog and digital filtering as a whole system to achieve the benefits both methods offer. As in the encoder, the isolation of digital and analog processes is achieved through fully balanced digital and analog systems, floating power supplies, and isolated grounding schemes which prevent interaction with cables and other external components. The result is a line level analog output signal. This completes the description of the signal path from the analog input of the encoder to the analog output of the decoder.

The following is a description of the control channel in the presently preferred embodiment which allows us to send control commands and auxiliary signal information from the encoder to the decoder in the same signal as the main program.

The command codes and other auxiliary data are encrypted with a pseudo-random noise and inserted into the least significant bit of the main signal digital words in a serial fashion, one bit per word. The LSB of the audio is replaced by a "random" noise for the duration of the control insertion. (Of course, more than one bit could be "borrowed" for this purpose, but more of the main program would be lost.) The system is set up so that when the control channel is not needed, the LSB carries the normal audio signal. Since the digital to analog converters in most of the current generation of digital audio products are not accurate to 16 bits; the loss of the 16th bit will not be audible during undecoded playback, as long as the information inserted there has noise-like properties. Even in high quality systems which do resolve all 16 bits, the insertion is not normally audible because the LSB of most programs already has very noise-like properties. The low level gain compression and dynamic dither described previously raise the level of the program during very quiet periods and help hide the code insertions during those program conditions under which they might be noticeable. In typical classical music programming, the control signal would be inserted for intervals of about a millisecond each occurring several times per second at most. The loss of full program resolution for these brief intervals is not noticeable.

Circuits to create random noise, modulate a control signal, insert it in the LSB of the data stream and then retrieve and decode it have been assembled and made to initiate filter selection from a hidden control signal. These circuits are included in Appendix B.

The process control signal is hidden in the least significant bit of the digital audio channel by modulating it with a noise signal. Our circuit consists of a pseudo-random noise generator based on a shift register with feedback which implements a maximal length sequence. This type of generator produces a deterministic sequence of bits which sounds very random, and yet is a reproducible sequence. The output of the noise generator is added to the control signal modulo-two (exclusive-or'ed), modulating the signal with noise, or scrambling it. The result is then inserted into the least significant bit of the record serial data stream. On the play side, the least significant bit is extracted from the serial digital stream and the output of a matching shift register is subtracted from it, modulo-two (exclusive-or again). The result is the process control signal, unscrambled again.

There are two basic variations of this scheme. The first version uses two noise generators, one on the record side and one on the play side. The record generator noise is added to the signal, and the play generator noise is subtracted. If the two generators produce the same bit sequence, the original signal is recovered. The problem is that the play generator must be synchronized with the noise sequence added during record. While there are many well-known approaches to solving this problem which are covered in the literature on spread spectrum communications, it is still a non-trivial problem. Although this approach is feasible, a presently preferred embodiment of the system employs the following technology.

In the preferred embodiment, the sum of the process control signal and the generator output is fed back to the generator input. This effectively "folds" the signal into the generator sequence so that the scrambled signal depends only on the recent history of the bits, and the play side contains a matching shift register with no feedback. Because the play side only uses "feed-forward" addition of the bits in the shift register, it is guaranteed to become synchronized as soon as N+1 bits have arrived, where N is the length of the shift register. The disadvantage of this approach is that it is possible for the noise generator to become stuck temporarily, depending on the characteristics of the process control signal. The probability of this happening can be made arbitrarily small by increasing the length of the shift registers. In the implementation shown in Appendix B, which uses a 17 bit shift register, the probability is on the order of 1 in 100,000 that a bit sequence might occur which could cause the generator to stick. By going to a 31 bit shift register, the probability drops to about 1 in 2 billion, which corresponds to once every 12.6 hours for a CD. If the process control signal is changing rapidly, the artifact of a "stuck" noise generator will be of short enough duration to be noise-like and inaudible. The problem of a stuck noise generator is only relevant if the control sequence is inserted continuously. In the preferred embodiment, in which the control is only inserted for brief intervals, it is not a problem for two reasons. First, since the LSB is returned to the program signal most of the time, the stuck generator output is not inserted into the signal. Secondly, dynamic insertion requires the use of a synchronizing sequence, as described below, which can be designed to guarantee that the generator does not get stuck.

Dynamic insertion of the control signal into the LSB or sharing the LSB with the main program data means that the reproducer has to be able to identify the commands embedded within the stream of arbitrary main program data. This is accomplished by preceding a command code with a synchronizing sequence of bits which the decoder looks for in the data stream. The sequence can be made long enough that the probability of its occurrence in the program data is extremely small, assuming that the program data is essentially random. Of course, one must avoid patterns that might appear with more than random frequency, such as long strings of ones or zeros which could occur during silent periods in the program. False triggering of the reproducer on program data can be completely eliminated on recordings incorporating the invention by having the encoder monitor the program data stream during recording and alter the least significant bit in one word if the synchronizing sequence is about to occur, thereby preventing it. This results in a bit error probability on the same order as the prevented false trigger probability, which can be made much less disruptive than the insertion of control codes, and so inconsequential.

It should be noted, that the aforedescribed technique can be used to hide arbitrary digital data in a digital audio signal or other digital signal representing analog data in which accuracy to the least significant bit is not continuously necessary. Such data inserted in place of or in addition to our process control signal could be used to control a multi-media presentation or for some other completely unrelated purpose.

It will be apparent from the foregoing description that those of ordinary skill in the audio, digital and data processing arts should be able to utilize a wide variety of computer and other electronic implementations in both hardware and software to practice many of the analysis, evaluation, encoding, decoding and compensation techniques embodied within the methods and apparatus of the present invention.

The aforedescribed systems of the present invention satisfy a long existing need in the art by providing new and improved digital encoding/decoding methods and apparatus for ultra low distortion reproduction of analog signals and which are also compatible with industry standardized signal playback apparatus not incorporating the decoding features of the present invention. In addition, signals lacking the encoding process features of the invention are likewise compatible with playback decoders which do embody the invention and are provided some overall enhancement.

The present invention provides an improved encode/decode system enabling a predetermined balance or interplay of gain, slew and wave synthesis operations to reduce signal distortions and improve apparent resolution. Analysis is made of waveform characteristics during the encoding process, and the results of this analysis are subsequently utilized in the decoding process to more accurately reconstruct the original waveform, while minimizing the deleterious effects normally encountered in sampling and converting analog signals to digital signals and subsequently reconverting the digital signals back to an accurate simulation of the original analog waveform.

In accordance with the invention, control information developed during the aforedescribed waveform analysis is concealed within a standard digital code and this information is subsequently used to dynamically change and control the reproduction process for best performance. These concealed control codes trigger appropriate decoding signal reconstruction compensation complementing the encoding process resulting from the signal analysis. Since the control code is silent and the overall digital information rate is normally fixed, the process can operate compatibly with existing equipment and to manufacturer's specifications and standards. In addition, and as previously indicated, signals lacking the encoding process features of the invention are likewise compatible with playback decoders which do embody the invention and are afforded some beneficial enhancement.

It will be apparent from the foregoing that, while particular forms and several aspects of the invention have been illustrated and described, various modifications can be made without departing from the spirit and scope of the invention. Accordingly, it is not intended that the invention be limited, except as by the appended claims.

We claim:

1. A system for converting and encoding an analog signal to a standardized digital format and subsequently decoding and converting said digital format to recover the analog signal, comprising:

means for monitoring the physical characteristics of an analog waveform to be converted to a digital format;

means for compatible amplitude resolution enhancement;

means for converting said analog waveform to said digital format;

means for encoding as compatible hidden code within said standardized digital format control information indicative of the physical characteristics of said analog waveform to facilitate said analog waveform being subsequently more accurately reconstructed from said digital format;

means for decoding from said digital format said control information indicative of certain specified physical characteristics of said analog waveform;

means for converting said digital format signal to said analog waveform; and means for introducing compatible signal reconstruction compensation, in accordance with said control information during said converting process, said information facilitating subsequent more accurate reconstruction of said analog waveform from said standardized digital format.

2. A system as set forth in claim 1, wherein said control information indicative of the physical characteristics of said analog waveform is encrypted within said digital format.

3. A system as set forth in claim 1, wherein said compensation involves slew correction.

4. A system as set forth in claim 1, wherein said compensation involves level correction.

5. A system as set forth in claim 1, wherein said compensation involves waveform synthesis.

6. A system as set forth in claim 1, wherein said means for compatible amplitude resolution enhancement includes low level control.

7. A system as set forth in claim 1, wherein said compatible amplitude resolution enhancement is done in complementary fashions controlled by a side channel.

8. A system as set forth in claim 1, wherein said means for compatible amplitude resolution enhancement includes control of decoding to complement encoding.

9. A system as set forth in claim 1, wherein said compatible amplitude resolution enhancement is done only at very low levels.

* * * * *

UNITED STATES PATENT AND TRADEMARK OFFICE
CERTIFICATE OF CORRECTION

PATENT NO. : 5,838,274
DATED : Nov. 17, 1998
INVENTOR(S) : Keith O, Johnson, Michael W. Pflaumer It is certified that error appears in the above-identified patent and that said Letters Patent is hereby corrected as shown below:

Column 10, line 19, after "5e", add --(5e-1 through 5e-5)--.

Column 10, line 25, after "7a", add --(7a-1 through 7a-4)--.

Column 10, line 25, after "7d", add --(7d-1 through 7d-4)--.

Column 18, line 49, change "FIG. 7b", to read --FIG. 7b-1 through 7b-4--.

Column 18, line 59, change "FIG. 7c", to read --FIG. 7c-1 through 7c-4--.

Column 19, line 1, change "FIG. 7d", to read --FIG. 7d-1 through 7d-4--.

Signed and Sealed this

Thirty-first Day of August, 1999

Attest:

Q. TODD DICKINSON

*Attesting Officer*  *Acting Commissioner of Patents and Trademarks*